(12) United States Patent
Tamura et al.

(10) Patent No.: US 11,894,426 B2
(45) Date of Patent: Feb. 6, 2024

(54) SEMICONDUCTOR DEVICE AND MANUFACTURING METHOD FOR SEMICONDUCTOR DEVICE

(71) Applicant: FUJI ELECTRIC CO., LTD., Kanagawa (JP)

(72) Inventors: Takahiro Tamura, Matsumoto (JP); Yuichi Onozawa, Matsumoto (JP)

(73) Assignee: FUJI ELECTRIC CO., LTD., Kanagawa (JP)

(*) Notice: Subject to any disclaimer, the term of this patent is extended or adjusted under 35 U.S.C. 154(b) by 126 days.

(21) Appl. No.: 17/486,984

(22) Filed: Sep. 28, 2021

(65) Prior Publication Data
US 2022/0013635 A1   Jan. 13, 2022

Related U.S. Application Data

(63) Continuation of application No. PCT/JP2020/038015, filed on Oct. 7, 2020.

(30) Foreign Application Priority Data

Oct. 17, 2019   (JP) ................. 2019-190022

(51) Int. Cl.
| | |
|---|---|
| H01L 29/10 | (2006.01) |
| H01L 21/265 | (2006.01) |
| H01L 27/06 | (2006.01) |

(52) U.S. Cl.
CPC ...... *H01L 29/1004* (2013.01); *H01L 21/2658* (2013.01); *H01L 21/26593* (2013.01); *H01L 27/0647* (2013.01)

(58) Field of Classification Search
CPC ............ H01L 29/1004; H01L 21/2658; H01L 21/26593; H01L 27/0647; H01L 29/083;
(Continued)

(56) References Cited

U.S. PATENT DOCUMENTS

| | | |
|---|---|---|
| 2004/0041225 A1 | 3/2004 | Nemoto |
| 2006/0081923 A1 | 4/2006 | Mauder |
| | (Continued) | |

FOREIGN PATENT DOCUMENTS

| | | |
|---|---|---|
| JP | 2003318412 A | 11/2003 |
| JP | 2008091853 A | 4/2008 |
| | (Continued) | |

OTHER PUBLICATIONS

International Search Report and (ISA/237) Written Opinion of the International Search Authority for International Patent Application No. PCT/JP2020/038015., mailed by the Japan Patent Office dated Dec. 28, 2020.

*Primary Examiner* — Yasser A Abdelaziez

(57) ABSTRACT

Provided is a semiconductor device including: a semiconductor substrate including a bulk donor; and a first buffer region of a first conductivity type, the first buffer region being provided on a lower surface side of the semiconductor substrate and having one or more doping concentration peaks and one or more hydrogen concentration peaks in a depth direction of the semiconductor substrate, in which a doping concentration at a shallowest concentration peak, out of the doping concentration peaks of the first buffer region, closest to the lower surface of the semiconductor substrate is 50 times as high as a concentration of the bulk donor of the semiconductor substrate or lower. The doping concentration at the shallowest concentration peak may be lower than a reference carrier concentration obtained when current that is 1/10 of rated current flows between an upper surface and the lower surface of the semiconductor substrate.

17 Claims, 18 Drawing Sheets

(58) Field of Classification Search
CPC ... H01L 29/0696; H01L 29/407; H01L 29/36; H01L 29/167; H01L 21/26513; H01L 29/0615; H01L 29/32; H01L 29/7397; H01L 27/0727; H01L 29/78; H01L 29/861; H01L 29/8613; H01L 29/6609; H01L 29/66477

See application file for complete search history.

(56) References Cited

U.S. PATENT DOCUMENTS

| | | | |
|---|---|---|---|
| 2007/0170512 A1* | 7/2007 | Gauthier, Jr. | H01L 27/0262 257/357 |
| 2008/0001257 A1 | 1/2008 | Schulze | |
| 2008/0054369 A1 | 3/2008 | Schulze | |
| 2012/0267681 A1 | 10/2012 | Nemoto | |
| 2014/0034998 A1 | 2/2014 | Schulze | |
| 2014/0246750 A1* | 9/2014 | Takishita | H01L 29/1095 257/493 |
| 2014/0246755 A1 | 9/2014 | Yoshimura | |
| 2015/0214347 A1 | 7/2015 | Falck | |
| 2015/0371858 A1 | 12/2015 | Laven | |
| 2017/0271450 A1 | 9/2017 | Takahashi | |
| 2017/0278929 A1* | 9/2017 | Imagawa | H01L 29/78 |
| 2017/0294527 A1 | 10/2017 | Suzuki | |
| 2018/0019131 A1 | 1/2018 | Suzuki | |
| 2018/0122895 A1 | 5/2018 | Jelinek | |
| 2018/0130875 A1 | 5/2018 | Suzuki | |
| 2019/0103479 A1* | 4/2019 | Suzuki | H01L 29/66333 |
| 2019/0148500 A1* | 5/2019 | Agata | H01L 29/1608 257/655 |

FOREIGN PATENT DOCUMENTS

| | | |
|---|---|---|
| JP | 2017168776 A | 9/2017 |
| JP | 2017188569 A | 10/2017 |
| JP | 2018078216 A | 5/2018 |
| JP | 2019067890 A | 4/2019 |
| WO | 2011052787 A1 | 5/2011 |
| WO | 2013089256 A1 | 6/2013 |
| WO | 2013100155 A1 | 7/2013 |
| WO | 2016147264 A1 | 9/2016 |
| WO | 2016204126 A1 | 12/2016 |
| WO | 2018135448 A1 | 7/2018 |

* cited by examiner

SEMICONDUCTOR DEVICE AND MANUFACTURING METHOD FOR SEMICONDUCTOR DEVICE

The contents of the following Japanese patent applications are incorporated herein by reference:
NO. 2019-190022 filed in JP on Oct. 17, 2019, and
NO. PCT/JP2020/038015 filed on Oct. 7, 2020.

BACKGROUND

1. Technical Field

The present invention relates to a semiconductor device and a manufacturing method for a semiconductor device.

2. Related Art

Conventionally, a structure in a semiconductor device, such as a diode, in which a buffer region of an N+ type is provided on a lower surface side of a semiconductor substrate is known (for example, see Patent documents 1 and 2).
Patent document 1: International Publication No. 2011-052787
Patent document 2: US Patent Application Publication No. 2015/0214347 specification
Preferably, oscillation is suppressed during a reverse recovery operation or the like of the semiconductor device.

GENERAL DISCLOSURE

To solve the problem described above, one aspect of the present invention provides a semiconductor device. The semiconductor device may include a semiconductor substrate including a bulk donor. The semiconductor device may include a first buffer region of a first conductivity type, the first buffer region being provided on a lower surface side of the semiconductor substrate and having one or more doping concentration peaks and one or more hydrogen concentration peaks in a depth direction of the semiconductor substrate. A doping concentration at a shallowest concentration peak, out of the doping concentration peaks of the first buffer region, closest to the lower surface of the semiconductor substrate may be 50 times as high as a bulk donor concentration of the semiconductor substrate or lower.

Doping concentrations at all of the doping concentration peaks of the first buffer region may be 50 times as high as the bulk donor concentration or lower.

The first buffer region may have two or more of the doping concentration peaks, and a doping concentration at at least one of the doping concentration peaks may be higher than 50 times as high as the bulk donor concentration.

The first buffer region may have two or more of the doping concentration peaks. A doping concentration at at least one of the doping concentration peaks may be higher than the doping concentration at the shallowest concentration peak.

The doping concentration at the shallowest concentration peak may be lower than a doping concentration of the doping concentration peak that is closest to the shallowest concentration peak.

The doping concentration at the shallowest concentration peak may be lower than a reference carrier concentration obtained when current that is 1/10 of rated current flows between an upper surface and the lower surface of the semiconductor substrate.

The semiconductor device may further include a trench portion arranged on an upper surface of the semiconductor substrate. When a concentration obtained by integrating a doping concentration of the semiconductor substrate from a lower end of the trench portion toward the lower surface of the semiconductor substrate is defined as an integral concentration, and a position at which the integral concentration reaches a critical integral concentration of the semiconductor substrate is defined as a critical position, the critical position may overlap the shallowest concentration peak or may be arranged closer to the trench portion than the shallowest concentration peak is.

The semiconductor device may further include a cathode region of the first conductivity type, having a peak value of a doping concentration that is higher than the shallowest concentration peak, the cathode region being provided between the shallowest concentration peak and the lower surface of the semiconductor substrate.

The semiconductor device may further include a lower surface side region of a second conductivity type provided between the shallowest concentration peak and the lower surface of the semiconductor substrate. A local minimum value of a valley portion of a donor concentration between the shallowest concentration peak and the cathode region may be smaller than a second concentration peak adjacent to the shallowest concentration peak on a side that is closer to an upper surface of the semiconductor substrate than the shallowest concentration peak is.

The semiconductor device may further include a collector region of a second conductivity type provided between the shallowest concentration peak and the lower surface of the semiconductor substrate.

The semiconductor device may further include a transistor portion and a diode portion. The diode portion may include the first buffer region. The diode portion may include a cathode region of the first conductivity type provided between the first buffer region and the lower surface of the semiconductor substrate. The transistor portion may include a second buffer region of the first conductivity type that is provided on the lower surface side of the semiconductor substrate and has one or more doping concentration peaks and one or more hydrogen concentration peaks in the depth direction of the semiconductor substrate. The transistor portion may include a collector region of a second conductivity type provided between the second buffer region and the lower surface of the semiconductor substrate.

Doping concentrations at the doping concentration peaks in the second buffer region may be same as doping concentrations at the doping concentration peaks provided at respective same depth positions in the first buffer region.

A doping concentration at a doping concentration peak, out of the doping concentration peaks of the second buffer region, closest to the lower surface of the semiconductor substrate may be higher than the doping concentration at the shallowest concentration peak of the first buffer region. A local minimum value of a valley portion of a donor concentration between the shallowest concentration peak and the cathode region may be smaller than a donor concentration at a boundary between a shallowest concentration peak of the second buffer region and the collector region.

A second aspect of the present invention provides a manufacturing method for a semiconductor device including a transistor portion and a diode portion. The manufacturing method may include forming, on an upper surface of a semiconductor substrate including a bulk donor, an emitter region of the transistor portion and an anode region of the diode portion as an active region. The manufacturing method may include performing ion implantation of a first dopant of a first conductivity type to the transistor portion and the diode portion from the lower surface of the semiconductor substrate, and performing ion implantation of a second dopant of the first conductivity type to the transistor portion from the lower surface of the semiconductor substrate.

A depth position to which the first dopant is implanted and a depth position to which the second dopant is implanted may be same.

The first dopant may be hydrogen.

The second dopant may be any one of hydrogen, phosphorus, or arsenic.

The summary clause does not necessarily describe all necessary features of the embodiments of the present invention. The present invention may also be a sub-combination of groups of the features described above.

DESCRIPTION OF EXEMPLARY EMBODIMENTS

Figure 1:
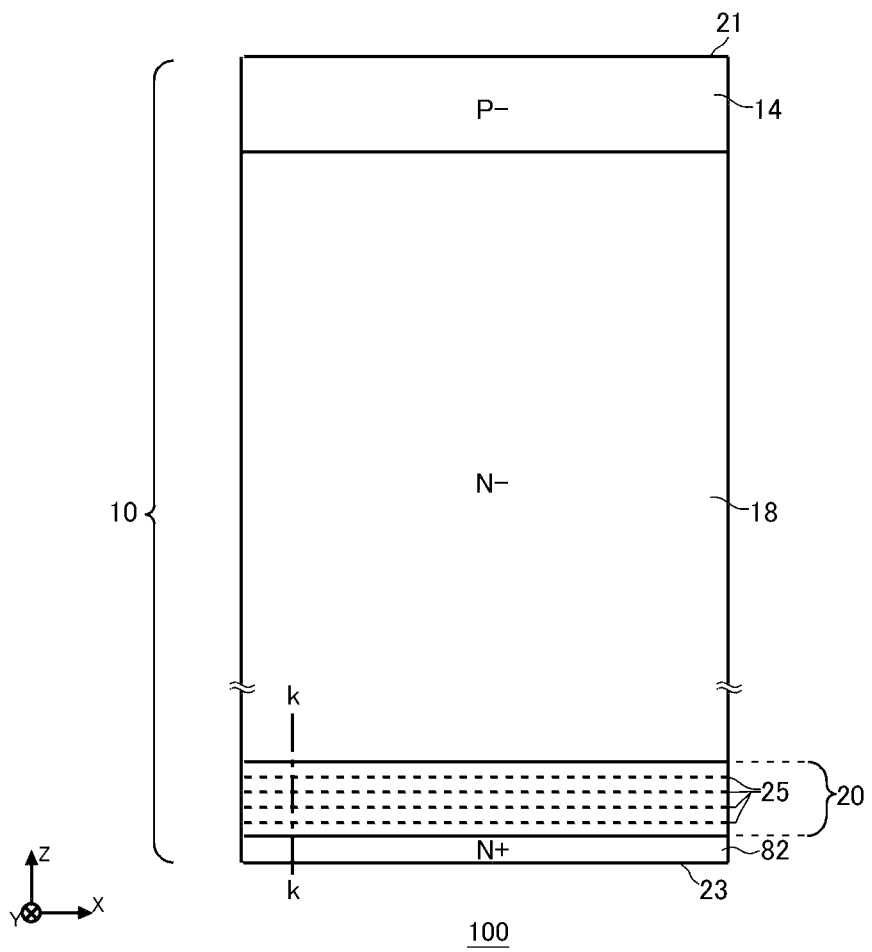
FIG. 1 is a cross-sectional view illustrating an example of a semiconductor device 100 according to an embodiment of the present invention.

Hereinafter, the present invention will be described with embodiments of the invention. However, the following embodiments have no intention of limiting the claimed invention. In addition, some combinations of features described in the embodiments may be unnecessary for solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which the semiconductor device is mounted.

As used herein, technical matters may be described by use of orthogonal coordinate axes of an X axis, a Y axis and a Z axis. The orthogonal coordinate axes are merely used for specifying relative positions between components, and thus not used for limiting the components in a specific direction. For example, the Z axis shall not exclusively indicate a height direction relative to the ground. Note that, a +Z axis direction and a −Z axis direction are directions opposite to each other. When the Z axis direction is described without a positive or a negative sign, the Z axis direction indicates a direction parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

One mentioned herein as "the same" or "equal" may include one with error derived from a variation in manufacturing or the like. This error is the one within a range of 10%, for example.

As used herein, a conductivity type of a doping region doped with an impurity is described as P type or N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity of the N type, or a semiconductor presenting conductivity of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D - N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect caused by a combination of a vacancy (V), an oxygen (O), and a hydrogen (H) existing in the semiconductor serves as a donor to supply electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type.

A chemical concentration in the present specification refers to an atomic density of an impurity measured regardless of an electrical activation state. The chemical concentration can be measured by, for example, secondary ion mass spectrometry (SIMS). The net doping concentration described above can be measured by voltage-capacitance profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the region of the N type may be referred to as the donor concentration, and the doping concentration of the region of the P type may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is approximately uniform in a region, or the like, an average value of the concentration of the donor, acceptor or net doping in the region may be set as the concentration of the donor, acceptor or net doping.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorus or arsenic serving as a donor, or an acceptor concentration of boron (boron) serving as an acceptor is about 99% of chemical concentrations of these. On the other hand, in a silicon semiconductor, a donor concentration of hydrogen serving as a donor is about 0.1% to 10% of a chemical concentration of hydrogen. In the present specification, SI unit system is employed. In the present specification, the unit of a distance or length may be represented in centimeters (cm). In this case, calculations may be done after the distance or length is converted into meters (m).

FIG. 1 is a cross-sectional view illustrating an example of a semiconductor device 100 according to an embodiment of the present invention. The semiconductor device 100 is provided with at least one of a transistor device such as an insulated gate bipolar transistor (IGBT) and a diode device such as a freewheeling diode (FWD). FIG. 1 illustrates the semiconductor device 100 provided with a diode device.

The semiconductor device 100 includes a semiconductor substrate 10. The semiconductor substrate 10 is a substrate formed of a semiconductor material. As an example, the semiconductor substrate 10 is a silicon substrate. A bulk donor of a first conductivity type (N type) is distributed in the entire semiconductor substrate 10 in the present example. The bulk donor is a donor doped with a dopant substantially uniformly included in an ingot, which is a base of the semiconductor substrate 10, at the time of manufacturing the ingot. The bulk donor in the present example is an element other than hydrogen. The dopant of the bulk donor is, for example, but not limited to, phosphorus, antimony, arsenic, selenium, or sulfur. The bulk donor in the present example is phosphorus. In this case, a bulk donor concentration may be a minimum value of the concentration of phosphorus in the semiconductor substrate 10. The bulk donor is also included in a P type region. The semiconductor substrate 10 may be a wafer sliced from a semiconductor ingot, or may be a chip diced from a wafer. The semiconductor ingot may be manufactured by any of Czochralski (CZ) method, Magnetic field applied Czochralski (MCZ) method, and Floating Zone (FZ) method. The ingot in the present example is manufactured by the MCZ method. The chemical concentration of the donor distributed in the entire semiconductor substrate 10 may be used as the bulk donor concentration Db, or the bulk donor concentration Db may be a value ranging from 90% to 100% of the chemical concentration.

The semiconductor substrate 10 has an upper surface 21 and a lower surface 23. The upper surface 21 and the lower surface 23 are two principal surfaces of the semiconductor substrate 10. In the specification, orthogonal axes in the plane that is parallel to the upper surface 21 and the lower surface 23 are referred to as an x axis and a y axis, and the perpendicular axis to the upper surface 21 and the lower surface 23 is referred to as a z axis.

The semiconductor substrate 10 of the present example includes a base region 14, a drift region 18, and a buffer region 20. The drift region 18 of the present example is an N− type region. The buffer region 20 is arranged on the lower surface 23 side of the semiconductor substrate 10. The buffer region 20 is an N type region with a higher doping concentration than the drift region 18. The lower surface 23 side indicates a region within a distance T/2 in a depth direction (Z axis direction) of the semiconductor substrate 10 from the lower surface 23, where T is the thickness of the semiconductor substrate 10 in the depth direction. The buffer region 20 may be provided in a region within a distance T/4 from the lower surface 23.

The buffer region 20 has a doping concentration peak 25 at which the doping concentration is higher than that in the drift region 18. The doping concentration at the doping concentration peak 25 refers to the doping concentration at the apex of the doping concentration peak 25. An average value of the doping concentration in a region where the doping concentration distribution is substantially even may be used as the doping concentration of the drift region 18. The region where the doping concentration distribution is substantially even may be a region with a width of 10 μm or more in the depth direction in which variation of the doping concentration does not exceed ±10%. The buffer region 20 of the present example has a plurality of the doping concentration peaks 25 in the depth direction (Z axis direction) of the semiconductor substrate 10.

The buffer region 20 of the present example is formed through heat treatment implemented by implanting hydrogen ions such as proton into the semiconductor substrate 10. The hydrogen ions may be implanted from the lower surface 23 of the semiconductor substrate 10 or may be implanted from the upper surface 21.

The base region 14 is a P− type region arranged between the drift region 18 and the upper surface 21 of the semiconductor substrate 10. When the semiconductor device 100 is a diode, the base region 14 functions as an anode region of the diode. When the semiconductor device 100 is a transistor, a channel is formed in the base region 14 facing the gate electrode. The base region 14 in FIG. 1 is in contact with the drift region 18. In another example, another region may be provided between the base region 14 and the drift region 18. The base region 14 may be in contact with the upper surface 21 of the semiconductor substrate 10.

The semiconductor substrate 10 of the present example includes a cathode region 82 of an N+ type provided between the buffer region 20 and the lower surface 23. The cathode region 82 is provided to be in contact with the lower surface 23. When the semiconductor device 100 is a transistor, the semiconductor substrate 10 includes a collector region of a P+ type provided between the buffer region 20 and the lower surface 23. The collector region 22 is provided to be in contact with the lower surface 23. The buffer region 20 may function as a field stop layer preventing a depletion layer spreading from the lower end of the base region 14 from reaching the collector region of the P+ type or the cathode region 82 of the N+ type.

The upper surface 21 and the lower surface 23 of the semiconductor substrate 10 are each provided with electrodes, which are omitted in FIG. 1. Each electrode may be formed of a metal material including aluminum or the like. In the present example, the electrode provided on the upper surface 21 is in contact with the base region 14, and the electrode provided on the lower surface 23 is in contact with the cathode region 82.

Figure 2:
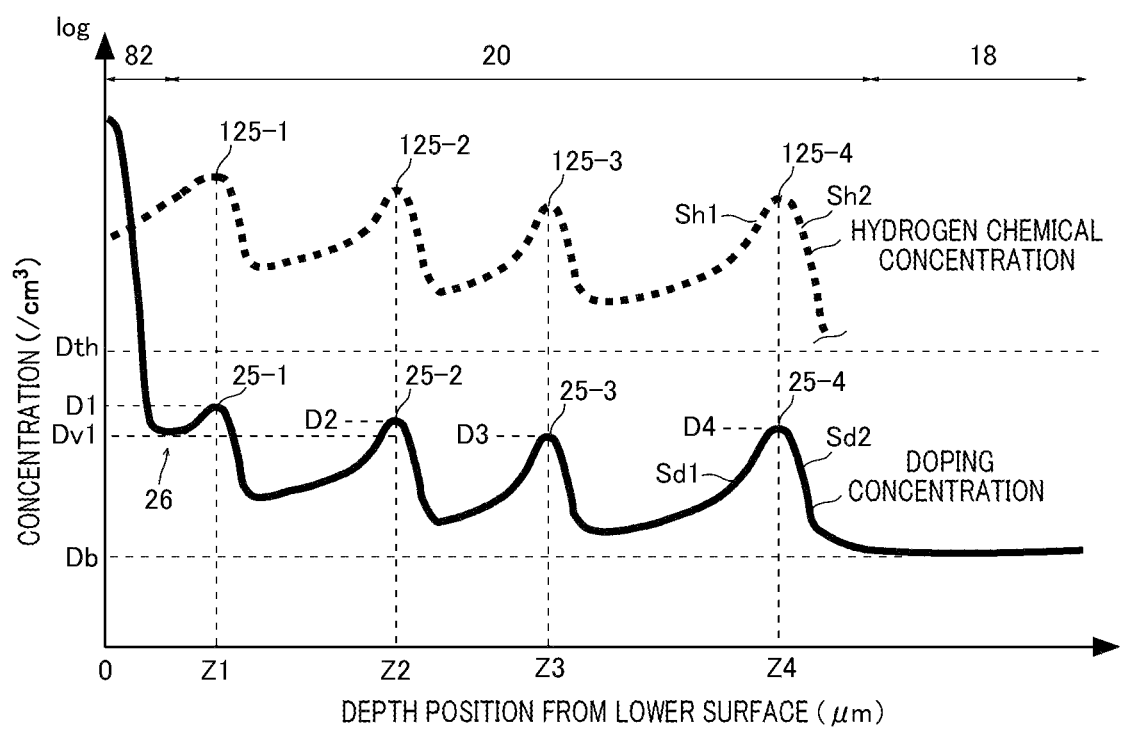
FIG. 2 is a diagram illustrating an example of a doping concentration distribution and a hydrogen chemical concentration distribution along a line k-k in FIG. 1.

FIG. 2 is a diagram illustrating an example of a doping concentration distribution and a hydrogen chemical concentration distribution along a line k-k in FIG. 1. The line k-k is a line, parallel to the Z axis, extending across the buffer region 20. The buffer region 20 of the present example is formed by implanting hydrogen ions to a predetermined depth position from the lower surface 23.

In a region through which the hydrogen ions implanted from the lower surface 23 have passed, a lattice defect mainly composed of vacancies, such as monoatomic vacancies (V) and divacancies (VV), is formed. The atoms adjacent to the vacancy include a dangling bond. The lattice defect includes interstitial atoms, transition, and the like, and in a broader sense, includes donors and acceptors, but in this specification, the lattice defect mainly composed of vacancies may be referred to as a vacancy type lattice defect, a vacancy type defect, or simply a lattice defect. The hydrogen ion implantation into the semiconductor substrate 10 may lead to formation of a large number of lattice defects, and result in substantial disturbance in crystallinity of the semiconductor substrate 10. This disturbance in crystallinity may be referred to as disorder herein. Hydrogen (H) implanted into the buffer region 20, vacancies (V), and oxygen (O) are attached to each other to form a VOH defect. Furthermore, the formation of the VOH defect is facilitated by diffusion of hydrogen as a result of thermal annealing. The VOH defect functions as a donor supplying electrons. The VOH defect may be simply referred to as a hydrogen donor herein. The buffer region 20 of the present example includes the hydrogen donor. The hydrogen donor may also be included in a region between two doping concentration peaks 25. The doping concentration of the hydrogen donor is lower than the chemical concentration of hydrogen. An activation ratio, which is defined as a ratio of the doping concentration of the hydrogen donor to the chemical concentration of hydrogen, may be a value of 0.1% to 30%. In the present example, the activation ratio is 1% to 5%.

The hydrogen chemical concentration distribution of the buffer region 20 includes one or more hydrogen concentration peaks 125, at the depth positions where the hydrogen ions are implanted. The hydrogen chemical concentration distribution of the present example includes a plurality of hydrogen concentration peaks 125-1, 125-2, 125-3, and 125-4. A higher hydrogen chemical concentration is likely to result in formation of a larger number of the VOH defects described above. Thus, the doping concentration distribution of the buffer region 20 has one or more doping concentration peaks 25 at the depth positions corresponding to the respective hydrogen concentration peaks 125. The doping concentration peaks 25 of the buffer region 20 may be hydrogen donor concentration peaks. The doping concentration distribution of the present example includes a plurality of doping concentration peaks 25-1, 25-2, 25-3, and 25-4.

The number of the doping concentration peaks 25 may be the same as the number of the hydrogen concentration peaks 125. A doping concentration peak 25 and a hydrogen concentration peak 125 may be provided at the same depth position. Peaks provided at the same depth position may refer to a state where an apex of one peak is arranged within the full width at half maximum of another peak.

The VOH defect is further formed in a region where the hydrogen diffuses, whereby the doping concentration in a region between the two doping concentration peaks 25 is also likely to rise. Thus, the region between the doping concentration peaks 25 can easily be a region with a higher concentration than the drift region 18.

In the present example, the hydrogen ions are implanted from the lower surface 23 side of the semiconductor substrate 10. Thus, in the hydrogen chemical concentration distribution, a tail Sh1 extending from the apex of each hydrogen concentration peak 125 toward the lower surface 23 side is gentler than a tail Sh2 extending from the apex of the hydrogen concentration peak 125 toward the upper surface 21 side. Thus, the tail Sh1 is less inclined than the tail Sh2. Similarly, in the doping concentration distribution, a tail Sd1 extending from the apex of each doping concentration peak 25 toward the lower surface 23 side may be gentler than a tail Sd2 extending from the apex of the doping concentration peak 25 toward the upper surface 21 side. Thus, the tail Sd1 may be less inclined than the tail Sd2.

Among the doping concentration peaks 25 of the buffer region 20, the peak closest to the lower surface 23 of the semiconductor substrate 10 is defined as the shallowest concentration peak. In the present example, the doping concentration peak 25-1 is the shallowest concentration peak. A doping concentration D1 at the doping concentration peak 25-1 is equal to or lower than a predetermined threshold concentration Dth. The threshold concentration Dth may be 50 times as high as the bulk donor concentration Db of the semiconductor substrate 10. The threshold concentration Dth may be 30 times, 20 times, or 10 times as high as the bulk donor concentration Db.

With the doping concentration at the doping concentration peak 25-1, which is the shallowest concentration peak, being equal to or lower than the threshold concentration Dth, the carriers can be prevented from being depleted and oscillation of a voltage or current waveform can be suppressed during reverse recovery of the semiconductor device 100 or the like.

In the present example, the doping concentrations D1, D2, D3, and D4 at all the doping concentration peaks 25-1, 25-2, 25-3, and 25-4 of the buffer region 20 are equal to or lower than the threshold concentration Dth. This enables the oscillation of the voltage or current waveform to be more effectively suppressed. The doping concentration at the doping concentration peak 25 may be lower at a position farther from the lower surface 23. Still, the doping concentration D4 at the doping concentration peak 25-4, which is arranged farthest from the lower surface 23, may be higher than the doping concentration D3 at the adjacent doping concentration peak 25-3. The doping concentration between the doping concentration peak 25-1 and the cathode region 82 may include a first valley portion 26 defined by a valley shaped concentration distribution. A local minimum value Dv1 of the doping concentration of the first valley portion 26 may be the local minimum value of the donor concentration. The local minimum value Dv1 of the doping concentration or the donor concentration may be smaller than the doping concentration D2 at the doping concentration peak 25-2. This more effectively prevents the carriers from being depleted and suppresses the oscillation of the voltage or current waveform during reverse recovery or the like. The local minimum value Dv1 of the doping concentration or the donor concentration may be equal to or lower than the predetermined threshold concentration Dth.

The peak value of the doping concentration of the cathode region 82 is higher than the doping concentration at the doping concentration peak 25-1. The peak value of the doping concentration of the cathode region 82 may be higher than the doping concentration at any of the doping concentration peaks 25 of the buffer region 20.

Figure 3:
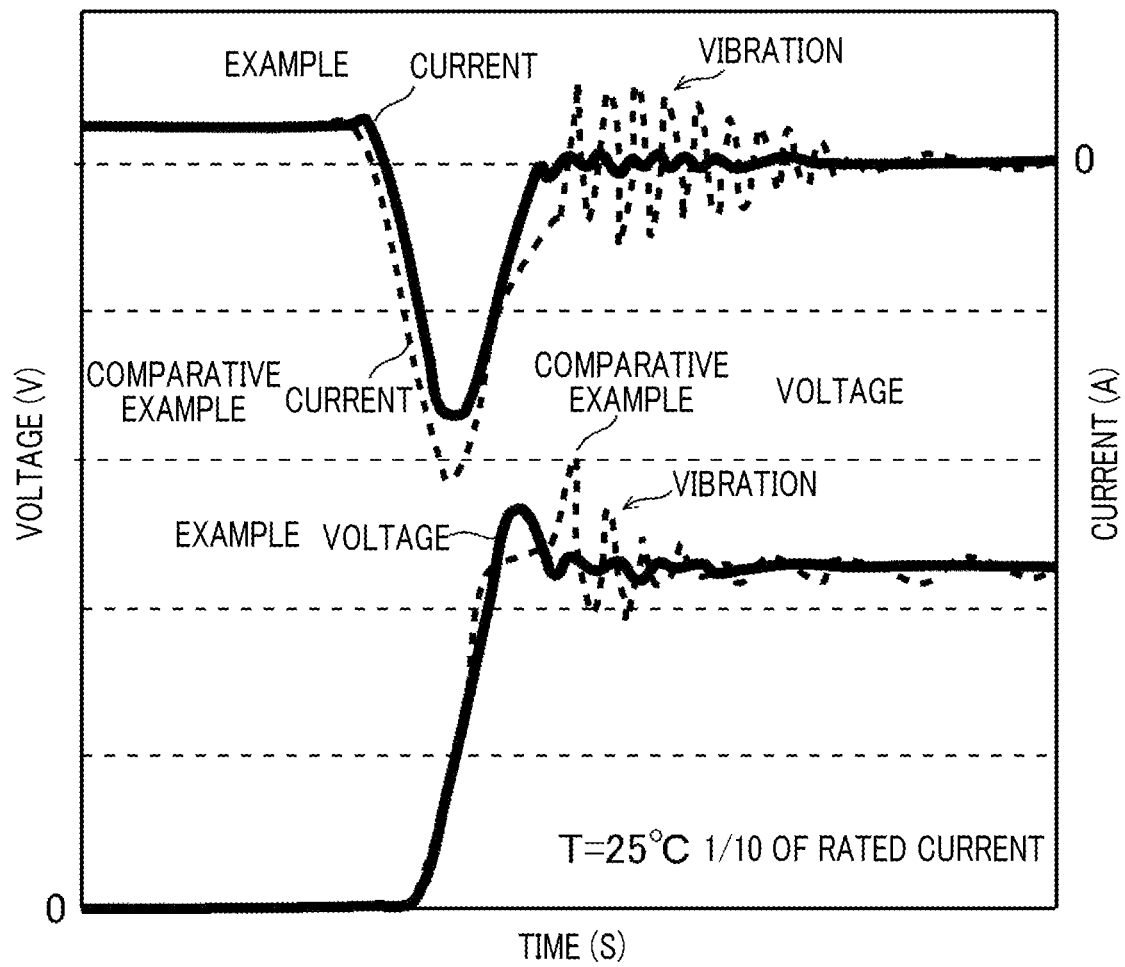
FIG. 3 is a diagram illustrating an example of a voltage waveform and a current waveform during reverse recovery of the semiconductor device 100.

FIG. 3 is a diagram illustrating an example of a voltage waveform and a current waveform during reverse recovery of the semiconductor device 100. The voltage waveform is a waveform of voltage applied between the electrode of the upper surface 21 and the electrode of the lower surface 23. The current waveform is a waveform of current flowing between the electrode of the upper surface 21 and the electrode of the lower surface 23. In FIG. 3, a dotted line represents a waveform of Comparative Example, and a solid line represents the waveform of the semiconductor device 100. In the example illustrated in FIG. 3, the surrounding temperature is 25° C., and the current when the semiconductor device 100 is in the ON state is $\frac{1}{10}$ of the rated current. In Comparative Example, the doping concentration at the shallowest concentration peak 25-1 is approximately 100 times as high as the bulk donor concentration Db. The doping concentrations at the other doping concentration peaks 25 are the same between Comparative Example and the semiconductor device 100.

A high doping concentration at the doping concentration peak 25 of the buffer region 20 leads to fewer holes in the vicinity of the doping concentration peak 25. Thus, during reverse recovery of the semiconductor device 100, the carriers are likely to be depleted in the vicinity of the doping concentration peak 25. Local depletion of carriers before the reverse recovery operation ends may result in oscillation of the voltage and the current waveforms during reverse recovery. The oscillation of the voltage and the current waveforms is particularly likely to occur during the reverse recovery, when the carriers are depleted in the vicinity of the lower surface 23 of the semiconductor substrate 10.

In Comparative Example, the doping concentration at the doping concentration peak 25-1 arranged in the vicinity of the lower surface 23 is high. Thus, the voltage waveform and the current waveform are largely vibrating in Comparative Example. On the other hand, in the semiconductor device 100, the doping concentration at the doping concentration peak 25-1 arranged in the vicinity of the lower surface 23 is 50 times as high as the bulk donor concentration Db or lower. Thus, with the semiconductor device 100, vibration of the voltage waveform and the current waveform is suppressed.

Figure 4:
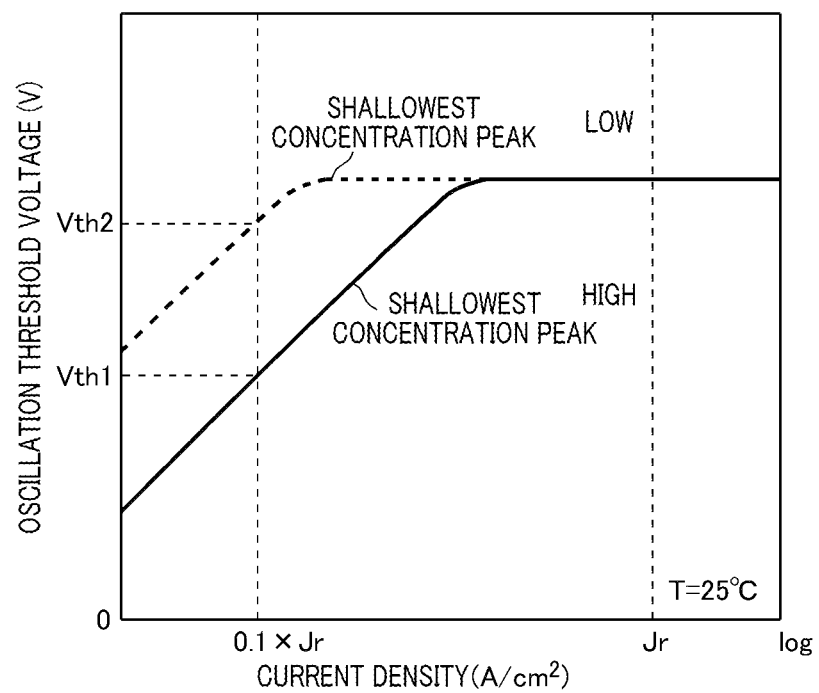
FIG. 4 is a diagram illustrating an example of relationship between current flowing in the semiconductor device 100 and an oscillation threshold voltage.

FIG. 4 is a diagram illustrating an example of relationship between current flowing in the semiconductor device 100 and an oscillation threshold voltage. The horizontal axis in FIG. 4 represents the density of current flowing between the electrode of the upper surface 21 and the electrode of the lower surface 23 of the semiconductor device 100. Jr represents the current density obtained when the rated current flows in the semiconductor device 100. Thus, the current density obtained when current that is $\frac{1}{10}$ of the rated current flows is 0.1×Jr. The oscillation threshold voltage is a voltage between the anode and the cathode, at which the voltage waveform and the current waveform start oscillating with a predetermined amplitude or larger, as can be seen in Comparative Example in FIG. 3. The predetermined amplitude is, for example, defined as an amplitude during a time period in which the absolute value of the voltage between the anode and the cathode is a value that is equal to or higher than a power source voltage. The oscillation with a predetermined amplitude or larger indicates, for example, a situation where the absolute value of the voltage between the anode and the cathode sharply increases in time relative to the predetermined amplitude, and this sharp increase triggers vibration of the subsequent voltage waveform. A lower density of the current flowing in the semiconductor device 100 leads to a smaller amount of accumulated carriers, and thus results in a higher risk of carrier depletion. Thus, as illustrated in FIG. 4, a lower density of the current flowing in the semiconductor device 100 leads to a lower oscillation threshold voltage, which is likely to involve oscillation.

FIG. 4 illustrates two examples that are an example where the doping concentration at the doping concentration peak 25-1, which is the shallowest concentration peak, is relatively high, and an example where the doping concentration is relatively low. A lower doping concentration at the doping concentration peak 25-1 leads to a higher oscillation threshold voltage, whereby the oscillation is suppressed. For example, when the current density satisfies 0.1×Jr, the oscillation threshold voltage of the example where the doping concentration at the doping concentration peak 25-1 is high is Vth1, and the oscillation threshold voltage of the example where the doping concentration is low is Vth2. Vth2 is higher than Vth1. Note that the oscillation start voltage may be power source voltage applied to the diode, when the voltage waveform or the current waveform is generated as a waveform with a predetermined amplitude or larger. Also in this case, the oscillation start voltage has characteristics similar to those in FIG. 4.

Figure 5A:
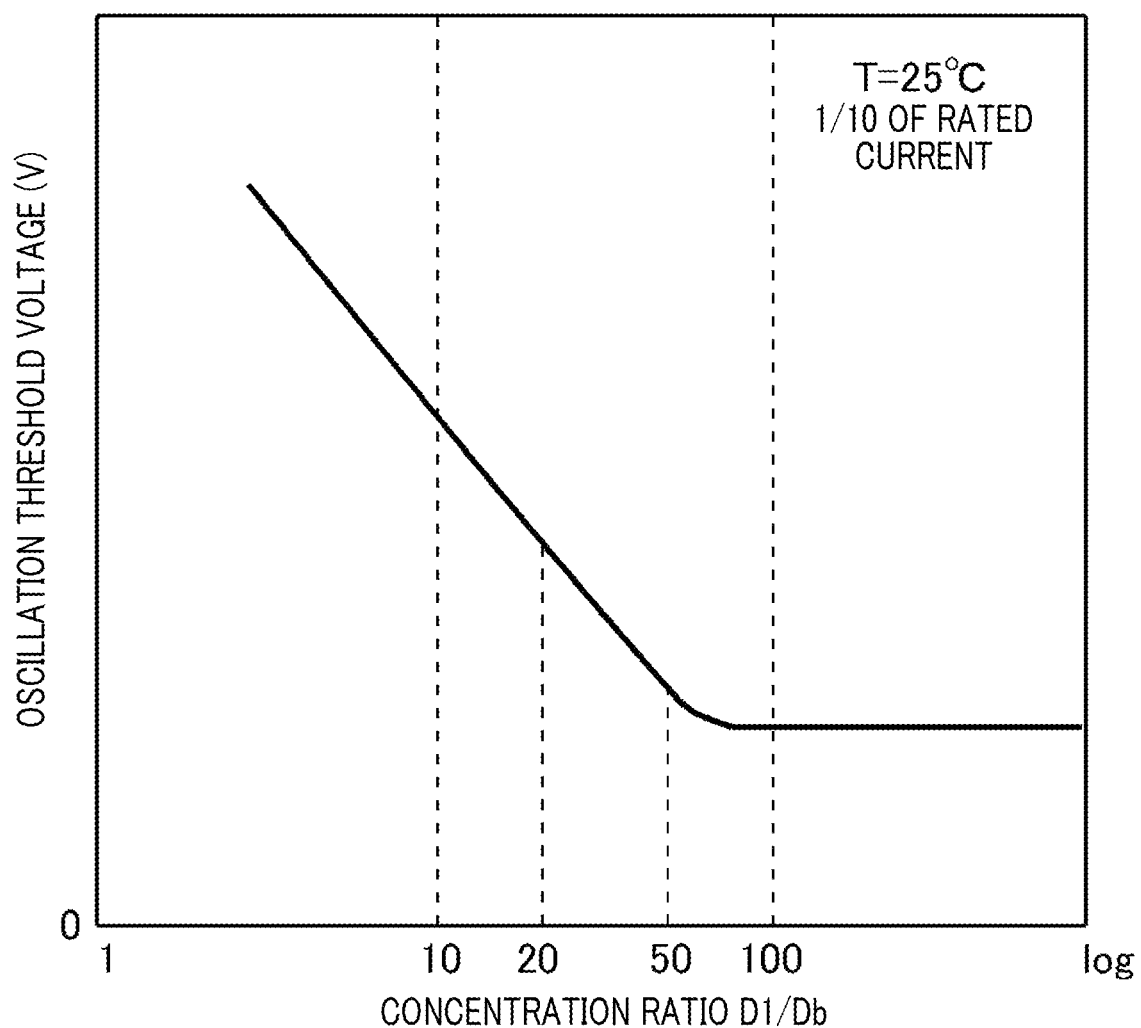
FIG. 5A is a diagram illustrating an example of relationship between a ratio D1/Db between a doping concentration D1 at a doping concentration peak 25-1 and a bulk donor concentration Db, and the oscillation threshold voltage.

FIG. 5A is a diagram illustrating an example of relationship between a ratio D1/Db between the doping concentration D1 at the doping concentration peak 25-1 and the bulk donor concentration Db, and the oscillation threshold voltage. With D1/Db set to be 50 or less, high oscillation threshold voltage can be obtained, whereby oscillation can be suppressed. D1/Db may be 20 or less, or may be 10 or less.

The threshold concentration Dth illustrated in FIG. 2 may be lower than a reference carrier concentration obtained with the current that is 1/10 of the rated current, flowing between the upper surface 21 and the lower surface 23 of the semiconductor substrate 10. For the rated current of the semiconductor device 100, a specification value in a catalogue of the semiconductor device 100 or the like may be used. A rated current density Jr can be calculated by dividing the rated current by the area of an active portion of the semiconductor device 100. The doping concentration of each region of the semiconductor device 100 may be measured by the SIMS method, the CV profiling, the SRP method, or the like.

Figure 5B:
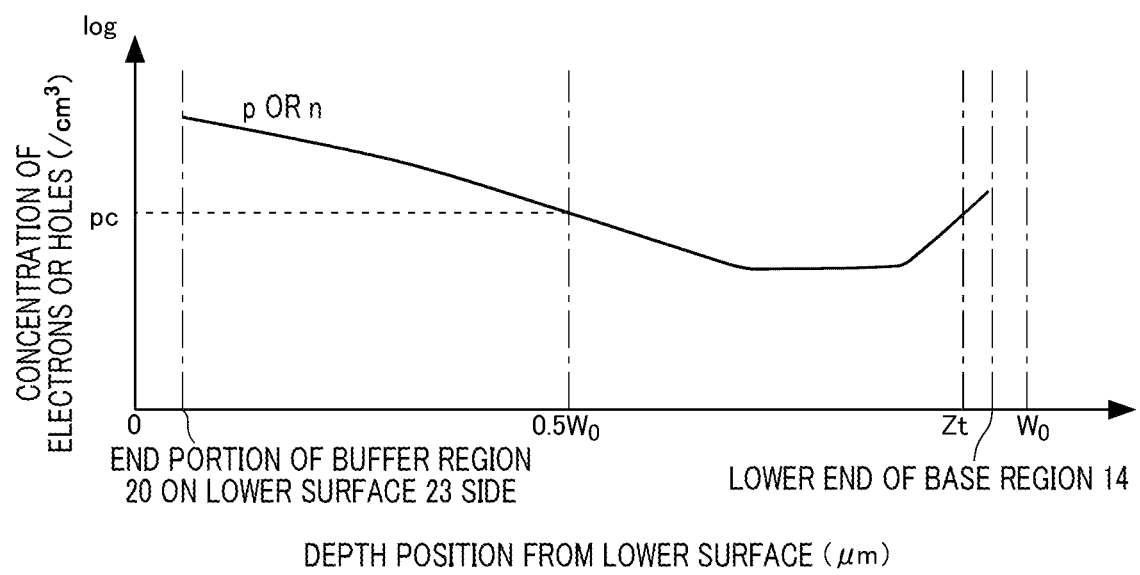
FIG. 5B illustrates an example of a carrier concentration distribution of each region, when a current density satisfies 0.1×Jr.

FIG. 5B illustrates an example of a carrier concentration distribution of each region, when the current density satisfies 0.1×Jr. The horizontal axis and the vertical axis in FIG. 5B respectively represent the distance from the lower surface 23 of the semiconductor substrate 10 and the concentration of electrons or holes. In the present example, $W_0$ represents the thickness of the semiconductor substrate 10 in the Z axis direction. Furthermore, Zt represents the position of the lower end of a trench portion in the Z axis direction. The trench portion is a gate trench portion or a dummy trench portion described later. The carrier concentration in each region can be calculated by simulation using the doping concentration of each region. In the present example, the regions are the drift region 18 and the buffer region 20. The position of the end portion of the drift region 18 on the upper surface 21 side may be a position of the lower end of the base region 14 (functioning as the anode region of the diode) or may be the position Zt of the lower end of the trench portion. The carrier concentration at the center 0.5 $W_0$ (or the center of the drift region 18 in the depth direction) of the semiconductor substrate 10 in the depth direction may be a reference carrier concentration $p_c$. The threshold concentration Dth may be ½ or less or ¼ or less of the reference carrier concentration $p_c$. Thus, oscillation of the voltage waveform and the current waveform can be suppressed.

Figure 6:
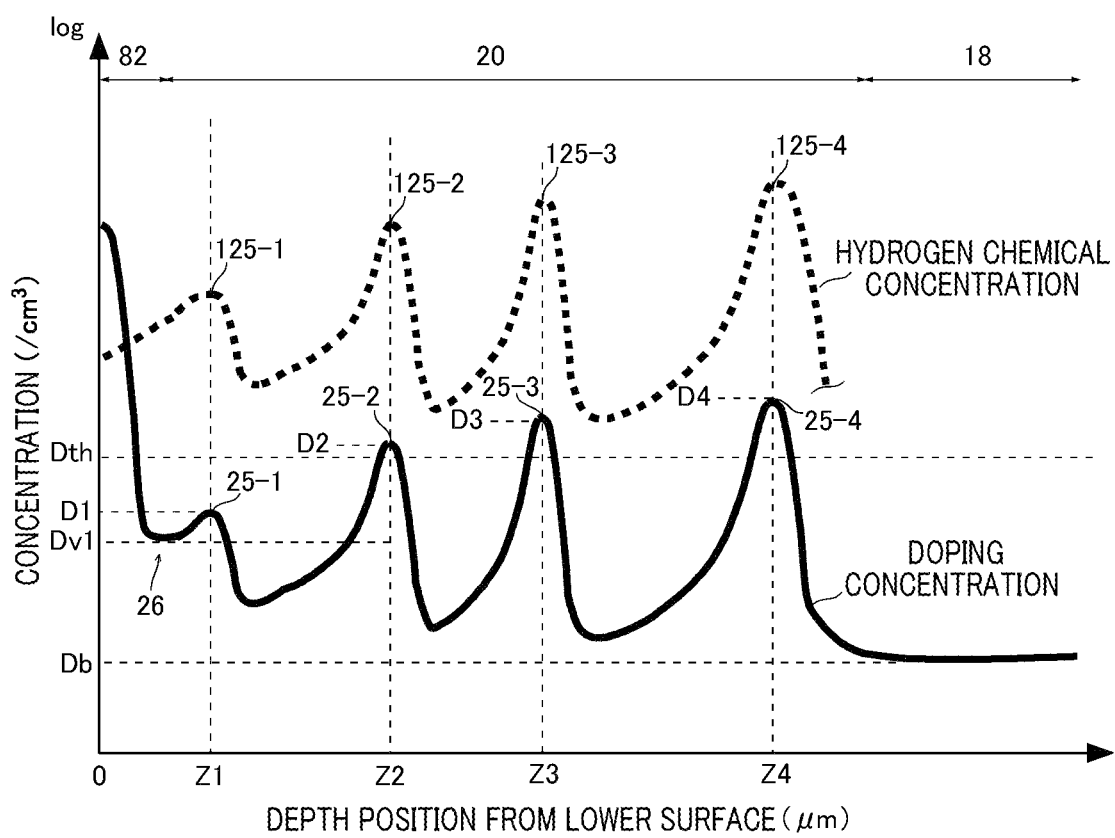
FIG. 6 is a diagram illustrating another example of the doping concentration distribution and the hydrogen chemical concentration distribution in a buffer region 20.

FIG. 6 is a diagram illustrating another example of the doping concentration distribution and the hydrogen chemical concentration distribution in the buffer region 20. The buffer region 20 of the present example has two or more doping concentration peaks 25.

In the present example, the doping concentration at at least one of the doping concentration peaks 25 is higher than the doping concentration D1 at the doping concentration peak 25-1. In the example illustrated in FIG. 6, the doping concentration D1 at the doping concentration peak 25-1 is lower than the doping concentration D2 at the doping concentration peak 25-2 closest to the doping concentration peak 25-1. Thus, the oscillation can be suppressed.

The doping concentration at at least one of the doping concentration peaks 25 may be higher than the threshold concentration Dth. With the doping concentration at any of the doping concentration peaks 25 being higher than the threshold concentration Dth, the depletion layer extending from the lower end of the base region 14 can be prevented from reaching the cathode region 82. An increase in the doping concentration at a doping concentration peak 25 other than the doping concentration peak 25-1 has a relatively small impact on the oscillation threshold voltage. Specifically, due to a relatively long distance between the lower surface 23 of the semiconductor substrate 10 and the doping concentration peak 25 with a high concentration, the carriers are likely to remain between the lower surface 23 and the doping concentration peak 25 with a high concentration. Thus, oscillation is suppressed.

In the example illustrated in FIG. 6, the doping concentrations at all of the doping concentration peaks 25 other than the doping concentration peak 25-1 are higher than the threshold concentration Dth. Thus, the depletion layer extending from the lower end of the base region 14 can be prevented from reaching the cathode region 82. The doping concentrations at the doping concentration peaks 25 may be higher at points farther from the lower surface 23. In the example illustrated in FIG. 6, D1<D2<D3<D4 holds. Thus, the depletion layer can be prevented from reaching the cathode region 82, while the oscillation threshold voltage is prevented from being low.

Figure 7:
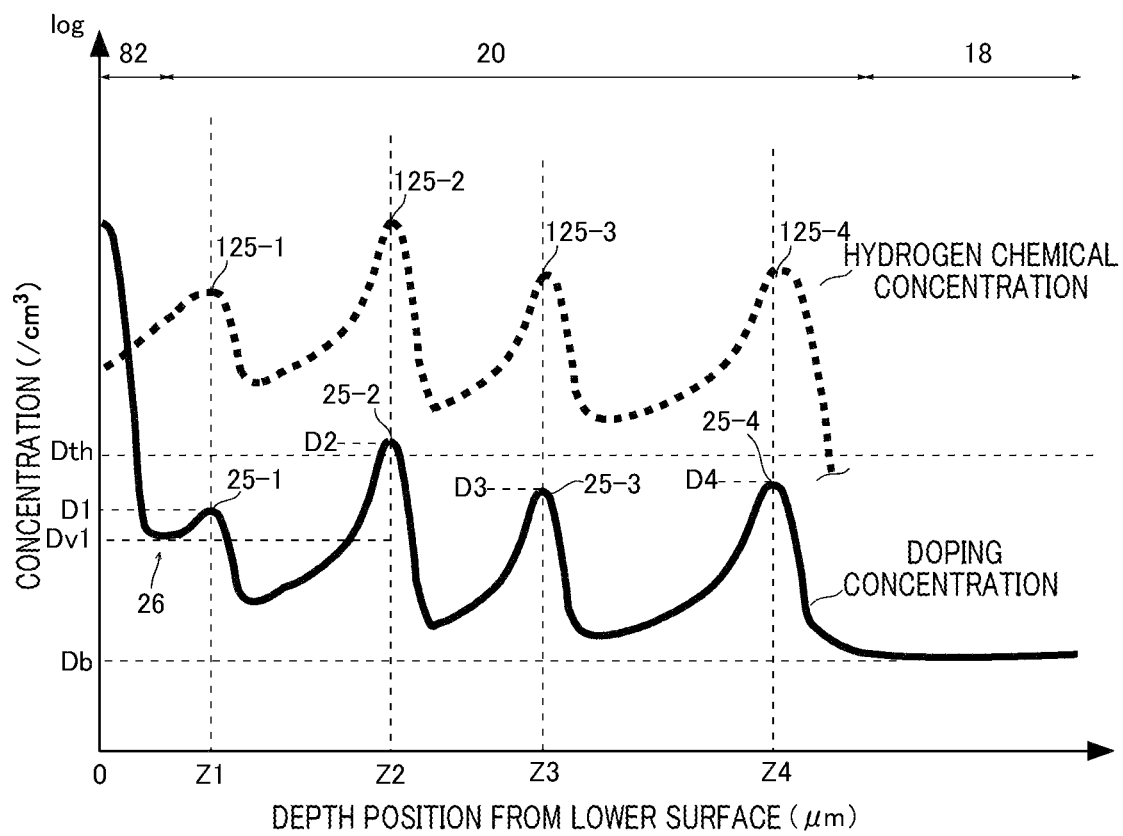
FIG. 7 is a diagram illustrating another example of the doping concentration distribution and the hydrogen chemical concentration distribution in the buffer region 20.

FIG. 7 is a diagram illustrating another example of the doping concentration distribution and the hydrogen chemical concentration distribution in the buffer region 20. In the present example, the doping concentration D2 at the doping concentration peak 25-2, which is arranged second closest to the lower surface 23, is higher than the threshold concentration Dth. The doping concentration at the doping concentration peak 25 arranged farther from the lower surface 23 than the doping concentration peak 25-2 may be higher or lower than the threshold concentration Dth. In the example illustrated in FIG. 7, the doping concentrations at all of the doping concentration peaks 25 arranged farther from the lower surface 23 than the doping concentration peak 25-2 are lower than the threshold concentration Dth. Also with this configuration, the oscillation can be suppressed, while the depletion layer extending from the lower end of the base region 14 is prevented from reaching the cathode region 82.

Figure 8:
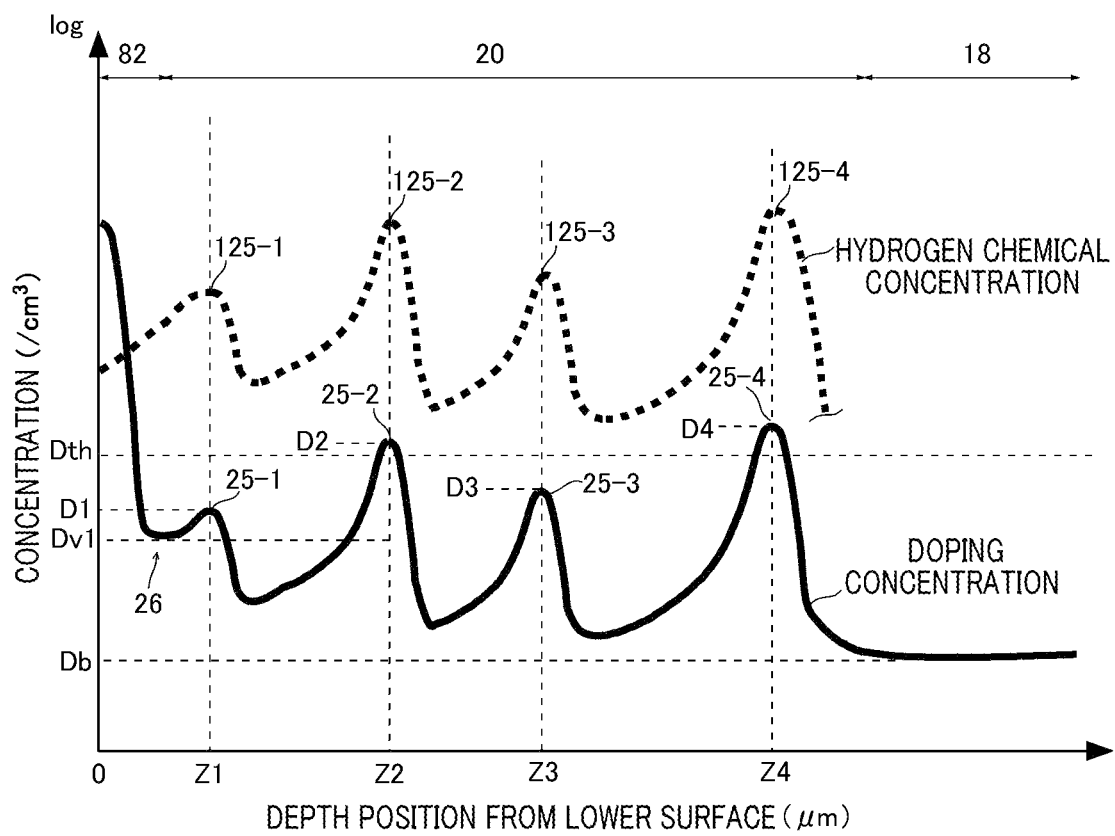
FIG. 8 is a diagram illustrating another example of the doping concentration distribution and the hydrogen chemical concentration distribution in the buffer region 20.

FIG. 8 is a diagram illustrating another example of the doping concentration distribution and the hydrogen chemical concentration distribution in the buffer region 20. In the present example, the doping concentration D4 at the doping concentration peak 25-4 arranged farthest from the lower surface 23 is higher than the threshold concentration Dth. The doping concentrations at the doping concentration peaks 25 between the doping concentration peak 25-1 and the doping concentration peak 25-4 may be higher or lower than the threshold concentration Dth. In the example illustrated in FIG. 8, the doping concentration at the doping concentration peak 25-2 is higher than the threshold concentration Dth. The doping concentration peak 25-3 with the doping concentration lower than the threshold concentration Dth is arranged between the doping concentration peak 25-2 and the doping concentration peak 25-4. Also with this configuration, the oscillation can be suppressed, while the depletion layer extending from the lower end of the base region 14 is prevented from reaching the cathode region 82.

Figure 9:
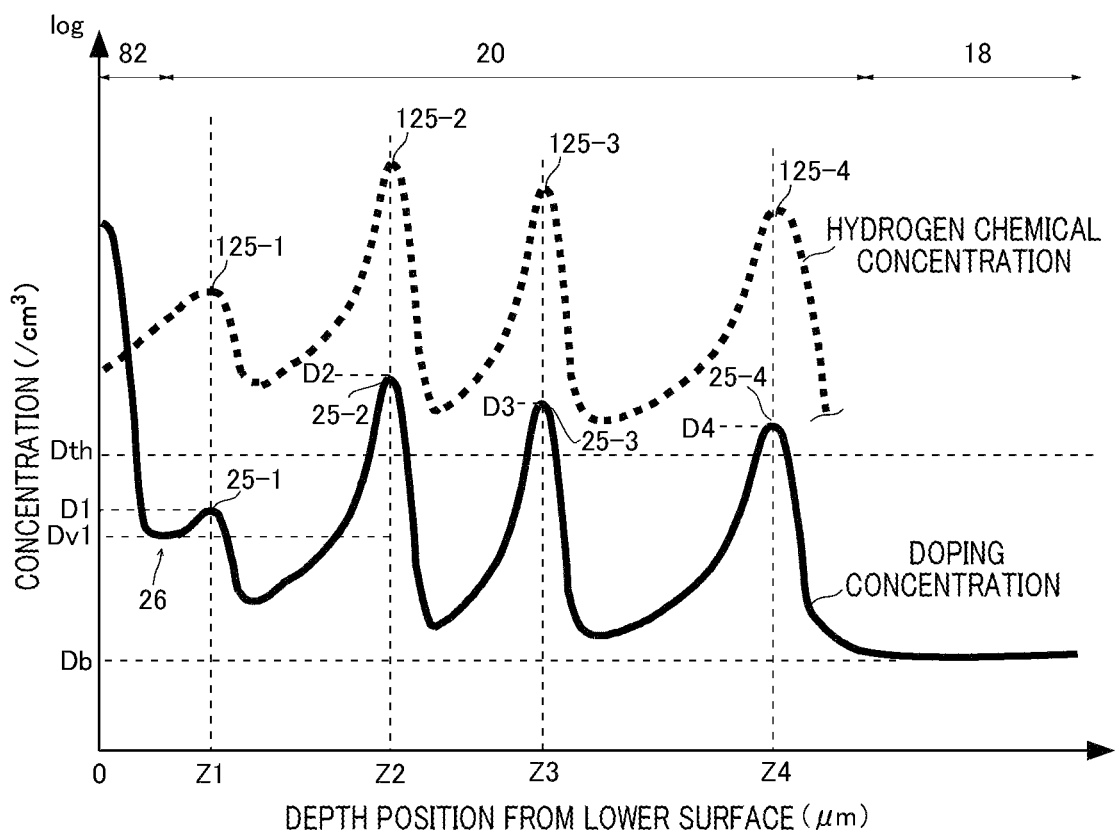
FIG. 9 is a diagram illustrating another example of the doping concentration distribution and the hydrogen chemical concentration distribution in the buffer region 20.

FIG. 9 is a diagram illustrating another example of the doping concentration distribution and the hydrogen chemical concentration distribution in the buffer region 20. In the present example, the doping concentrations at all the doping concentration peaks 25 other than the doping concentration peak 25-1 are higher than the threshold concentration Dth. Still, the doping concentrations at the doping concentration peaks 25 other than the doping concentration peak 25-1 are lower at points farther from the lower surface 23. Also with this configuration, the oscillation can be suppressed, while the depletion layer extending from the lower end of the base region 14 is prevented from reaching the cathode region 82.

Figure 10:
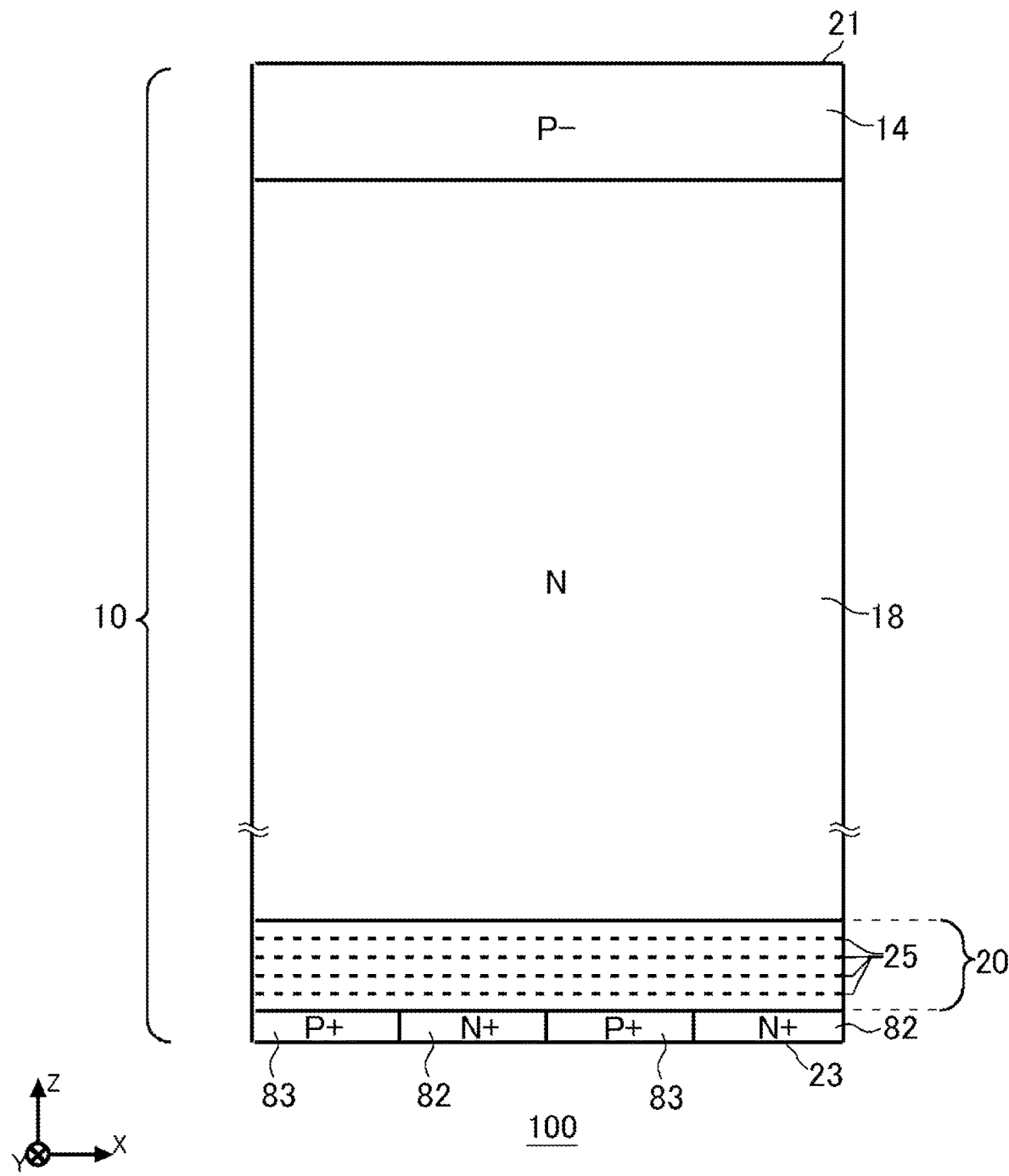
FIG. 10 is a cross-sectional view illustrating another configuration example of the semiconductor device 100.

FIG. 10 is a cross-sectional view illustrating another configuration example of the semiconductor device 100. The semiconductor device 100 of the present example includes a P+ type lower surface side region 83. The structure other than the lower surface side region 83 is the same as that of the semiconductor device 100 of the aspects described with reference to FIG. 1 to FIG. 9. The lower surface side region 83 is selectively arranged in a region in contact with the lower surface 23. Thus, the region in contact with the lower surface 23 is provided with the cathode region 82 and the lower surface side region 83. With the lower surface side region 83 provided, the amount of electrons injected from the lower surface 23 side can be adjusted. During the reverse recovery or the like, holes can be supplied from the lower surface 23 side. Thus, the oscillation can be suppressed.

Figure 11:
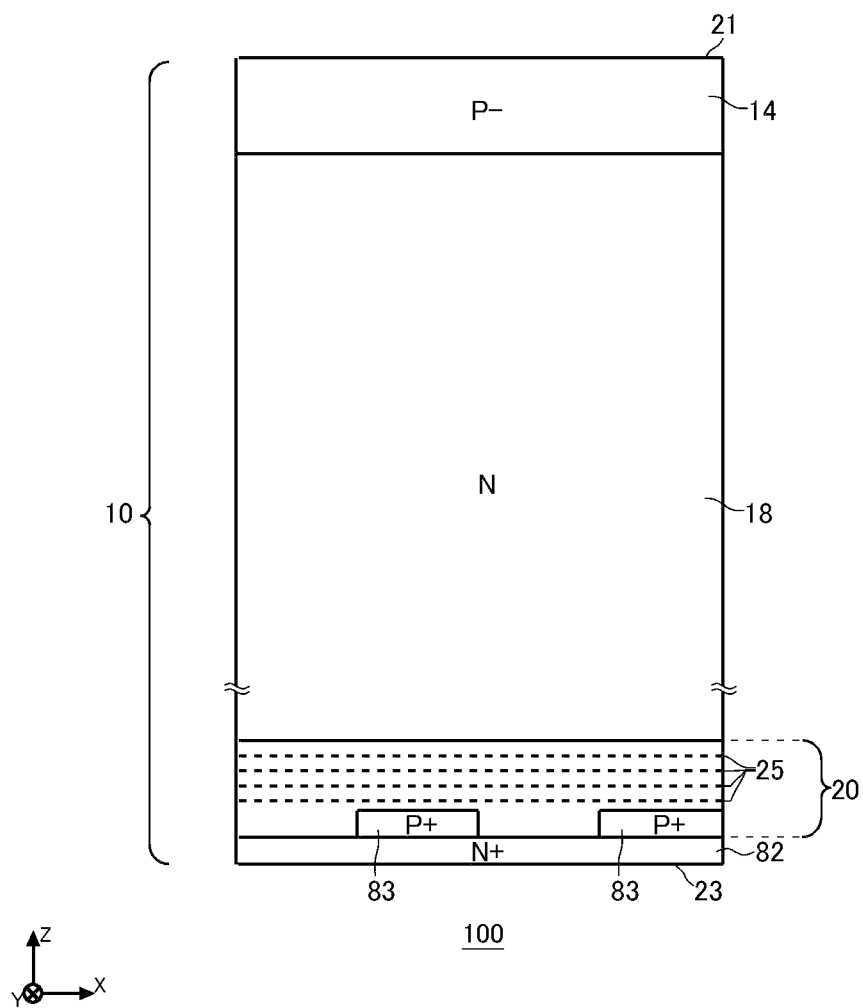
FIG. 11 is a cross-sectional view illustrating another configuration example of the semiconductor device 100.

FIG. 11 is a cross-sectional view illustrating another configuration example of the semiconductor device 100. The semiconductor device 100 of the present example includes a P+ type lower surface side region 83. The structure other than the lower surface side region 83 is the same as that of the semiconductor device 100 of the aspects described with reference to FIG. 1 to FIG. 9. The lower surface side region 83 is arranged between the cathode region 82 and the doping concentration peak 25-1. The lower surface side region 83 is a floating region not in contact with the lower surface 23. The lower surface side region 83 is selectively arranged on the upper surface of the cathode region 82. Thus, a part of the upper surface of the cathode region 82 is not covered with the lower surface side region 83. With the lower surface side region 83 provided, the amount of electrons injected from the lower surface 23 side can be adjusted. During the reverse recovery or the like, holes can be supplied from the lower surface 23 side. Thus, the oscillation can be suppressed.

Figure 12:
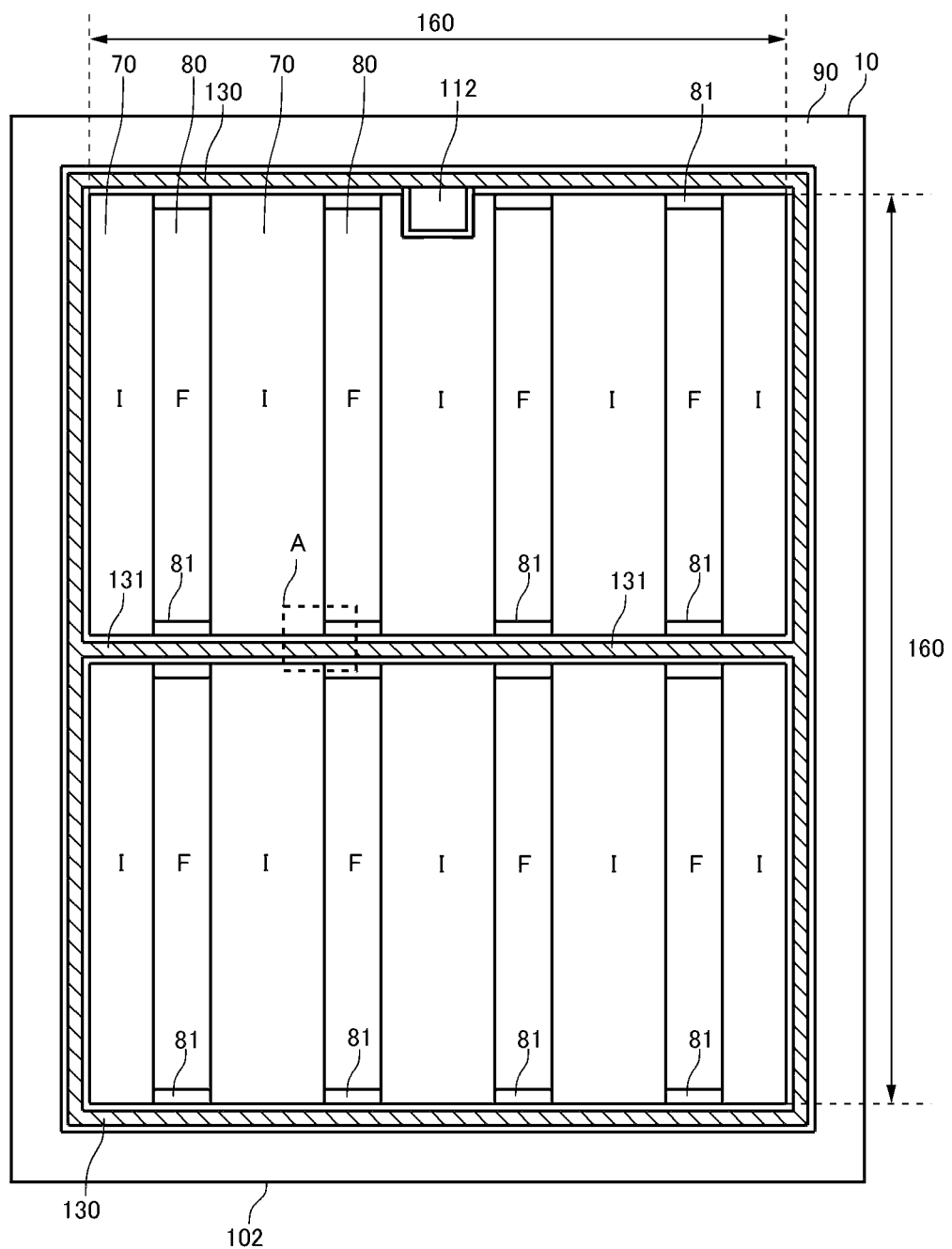
FIG. 12 is a top plan view illustrating another example of the semiconductor device 100.

FIG. 12 is a top plan view illustrating another example of the semiconductor device 100. FIG. 12 illustrates a position at which each member is projected on the upper surface of the semiconductor substrate 10. FIG. 12 illustrates merely some members of the semiconductor device 100, and omits illustrations of some members.

The semiconductor device 100 includes the semiconductor substrate 10. The semiconductor substrate 10 has an end side 102 in the top plan view. When the top plan view is merely mentioned in the present specification, it means that an upper surface side of the semiconductor substrate 10 is viewed from above. The semiconductor substrate 10 of the present example has two sets of end sides 102 opposite to each other in the top plan view. In FIG. 12, the X axis and the Y axis are parallel to any of the end sides 102. Further, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor device 100 operates. An emitter electrode is provided above the active portion 160, but an illustration thereof is omitted in FIG. 12.

The active portion 160 is provided with at least one of a transistor portion 70 including a transistor device such as an IGBT, and a diode portion 80 including a diode device such as a freewheeling diode (FWD). In the example of FIG. 12, the transistor portion 70 and the diode portion 80 are alternately arranged along a predetermined array direction (the X axis direction in the present example) on the upper surface of the semiconductor substrate 10. The active portion 160 in another example may be provided with only one of the transistor portion 70 and the diode portion 80.

In FIG. 12, a region where the transistor portion 70 is arranged is denoted by a symbol "I", and a region where the diode portion 80 is arranged is denoted by a symbol "F". In the present specification, a direction perpendicular to an array direction in the top plan view may be referred to as an extension direction (the Y axis direction in FIG. 12). Each of the transistor portion 70 and the diode portion 80 may have a longitudinal length in the extension direction. That is, for the transistor portion 70, a length in the Y axis direction is greater than a width in the X axis direction. Similarly, for the diode portion 80, a length in the Y axis direction is greater than a width in the X axis direction. The extension directions of the transistor portion 70 and the diode portion 80 may respectively be the same as a longitudinal direction of each trench portion described below.

The diode portion 80 has a cathode region of the N+ type in a region in contact with the lower surface of the semiconductor substrate 10. In the present specification, the region where the cathode region is provided is referred to as the diode portion 80. That is, the diode portion 80 is a region which overlaps the cathode region in the top plan view. On the lower surface of the semiconductor substrate 10, a collector region of the P+ type may be provided in a region other than the cathode region. In the present specification, the diode portion 80 may also include an extension region 81 where the diode portion 80 extends, in the Y axis direction, up to a gate runner described below. On a lower surface of the extension region 81, the collector region is provided.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor device 100 may have one or more pads above the semiconductor substrate 10. The semiconductor device 100 of the present example has a gate pad 112. The semiconductor device 100 may have a pad such as an anode pad, a cathode pad, and a current detection pad. Each pad is arranged in the vicinity of the end side 102. The region in the vicinity of the end side 102 refers to a region between the end side 102 and the emitter electrode in the top plan view. When the semiconductor device 100 is mounted, each pad may be connected to an external circuit via wiring such as a wire.

A gate potential is applied to the gate pad 112. The gate pad 112 is electrically connected to a conductive portion of a gate trench portion of the active portion 160. The semiconductor device 100 includes a gate runner which connects the gate pad 112 and the gate trench portion. In FIG. 12, the gate runner is hatched with diagonal lines.

The gate runner of the present example has an outer peripheral gate runner 130 and an active side gate runner 131. The outer peripheral gate runner 130 is arranged between the active portion 160 and the end side 102 of the semiconductor substrate 10 in the top plan view. The outer peripheral gate runner 130 of the present example surrounds the active portion 160 in the top plan view. A region surrounded by the outer peripheral gate runner 130 in the top plan view may be set as the active portion 160. Further, the outer peripheral gate runner 130 is connected to the gate pad 112. The outer peripheral gate runner 130 is arranged above the semiconductor substrate 10. The outer peripheral gate runner 130 may be metal wiring including aluminum or the like.

The active side gate runner 131 is provided in the active portion 160. By providing the active side gate runner 131 in the active portion 160, it is possible to reduce a variation in wiring length from the gate pad 112 with respect to each region of the semiconductor substrate 10.

The active side gate runner 131 is connected to the gate trench portion of the active portion 160. The active side gate runner 131 is arranged above the semiconductor substrate 10. The active side gate runner 131 may be wiring formed of a semiconductor such as polysilicon doped with an impurity.

The active side gate runner 131 may be connected to the outer peripheral gate runner 130. The active side gate runner 131 of the present example is provided to extend in the X axis direction so as to cross the active portion 160 from one outer peripheral gate runner 130 to the other outer peripheral gate runner 130 at substantially the center in the Y axis direction. When the active portion 160 is divided by the active side gate runner 131, the transistor portion 70 and the diode portion 80 may be alternately arranged in the X axis direction in each divided region.

Further, the semiconductor device 100 may include a temperature sensing portion (not illustrated) which is a PN junction diode formed of polysilicon or the like, and a current detection portion (not illustrated) which simulates an operation of the transistor portion provided in the active portion 160.

The semiconductor device 100 of the present example includes an edge termination structure portion 90 between the active portion 160 and the end side 102. The edge termination structure portion 90 of the present example is arranged between the outer peripheral gate runner 130 and the end side 102. The edge termination structure portion 90 relaxes an electric field concentration on the upper surface side of the semiconductor substrate 10. The edge termination structure portion 90 may further include at least one of a guard ring, a field plate, and a RESURF provided in an annular form surrounding the active portion 160.

Figure 13:
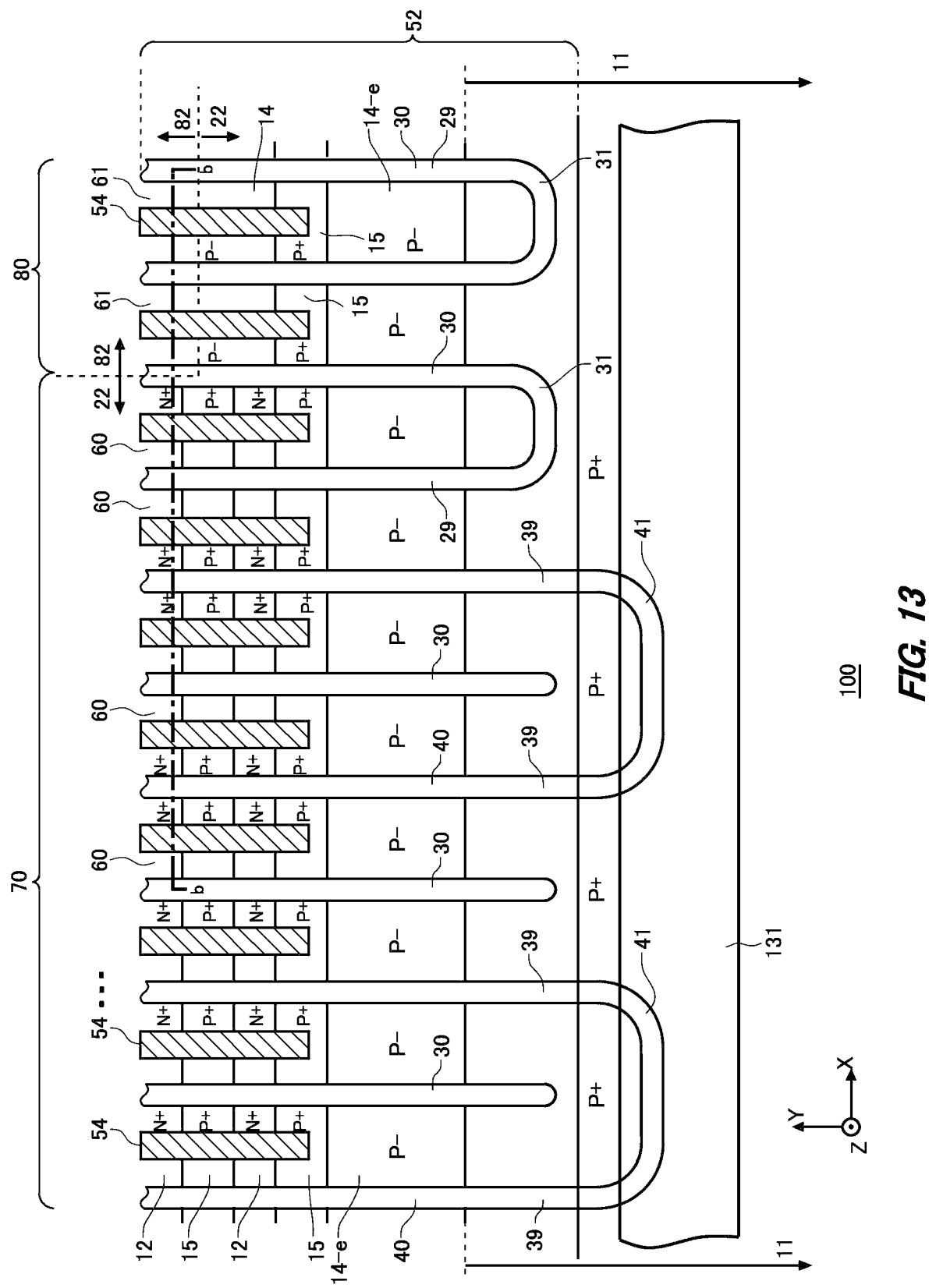
FIG. 13 is an enlarged view of Region A in FIG. 12.

FIG. 13 is an enlarged view of Region A in FIG. 12. The region A is a region including the transistor portion 70, the diode portion 80, and the active side gate runner 131. The semiconductor device 100 of the present example includes a gate trench portion 40, a dummy trench portion 30, a well region 11, an emitter region 12, a base region 14, and a contact region 15 that are provided inside the upper surface side of the semiconductor substrate 10. Each of the gate trench portion 40 and the dummy trench portion 30 is an example of a trench portion. Further, the semiconductor device 100 of the present example includes an emitter electrode 52 and the active side gate runner 131 which are provided above the upper surface of the semiconductor substrate 10. The emitter electrode 52 and the active side gate runner 131 are provided in isolation from each other.

Between the emitter electrode 52 and the active side gate runner 131, and the upper surface of the semiconductor substrate 10, an interlayer dielectric film is provided, but an illustration thereof is omitted in FIG. 13. In the interlayer dielectric film of the present example, a contact hole 54 is provided to pass through the interlayer dielectric film. In FIG. 13, each contact hole 54 is hatched with the diagonal lines.

The emitter electrode 52 is provided above the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active side gate runner 131 is connected to the gate trench portion 40 through the contact hole provided in the interlayer dielectric film. The active side gate runner 131 may be connected to a gate conductive portion of the gate trench portion 40 at an edge portion 41 of the gate trench portion 40 in the Y axis direction. The active side gate runner 131 is not connected to the dummy conductive portion in the dummy trench portion 30.

The emitter electrode 52 is formed of a material including metal. FIG. 13 illustrates a range where the emitter electrode 52 is provided. For example, at least a part of the region of the emitter electrode 52 is formed by aluminum (Al), or a metal alloy such as an aluminum-silicon alloy or an aluminum-silicon-copper alloy, including AlSi or AlSiCu, for example. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided to overlap the active side gate runner 131. The well region 11 is provided to extend with a predetermined width also in a range not overlapping the active side gate runner 131. The well region 11 of the present example is provided to be away from an end of the contact hole 54 in the Y axis direction toward the active side gate runner 131 side. The well region 11 is a region of a second conductivity type that has a higher doping concentration than that of the base region 14. The base region 14 of the present example is of the P− type, and the well region 11 is of the P+ type.

Each of the transistor portion 70 and the diode portion 80 has a plurality of trench portions which are arrayed in an array direction. In the transistor portion 70 of the present example, one or more gate trench portions 40 and one or more dummy trench portions 30 are alternately provided along the array direction. The diode portion 80 of the present example is provided with the plurality of dummy trench portions 30 along the array direction. The diode portion 80 of the present example is not provided with the gate trench portion 40.

The gate trench portion 40 of the present example may have two linear portions 39 extending along the extension direction perpendicular to the array direction (portions of a trench that are linear along the extension direction), and the edge portion 41 connecting the two linear portions 39. The extension direction in FIG. 13 is the Y axis direction.

Preferably, at least a part of the edge portion 41 is provided in a curved shape in the top plan view. By the edge portion 41 connecting between end portions of the two linear portions 39 in the Y axis direction, it is possible to relax the electric field concentration at the end portions of the linear portions 39.

In the transistor portion 70, the dummy trench portions 30 are provided between the respective linear portions 39 of the gate trench portions 40. Between the respective linear portions 39, one dummy trench portion 30 may be provided, or a plurality of dummy trench portions 30 may be provided. The dummy trench portion 30 may have a linear shape extending in the extension direction, and may have linear portions 29 and an edge portion 31 similarly to the gate trench portion 40. The semiconductor device 100 illustrated in FIG. 13 includes both of the linear dummy trench portion 30 having no edge portion 31, and the dummy trench portion 30 having the edge portion 31.

A diffusion depth of the well region 11 may be deeper than depths of the gate trench portion 40 and the dummy trench portion 30. The end portions of the gate trench portion 40 and the dummy trench portion 30 in the Y axis direction are provided in the well region 11 in the top plan view. That is, at the end portion of each trench portion in the Y axis direction, a bottom portion of each trench portion in the depth direction is covered with the well region 11. This makes it possible to relax the electric field concentration at the bottom portion of each trench portion.

Between the respective trench portions in the array direction, a mesa portion is provided. The mesa portion refers to a region interposed between the trench portions inside the semiconductor substrate 10. As an example, an upper end of the mesa portion is the upper surface of the semiconductor substrate 10. A depth position of a lower end of the mesa portion is the same as a depth position of a lower end of a trench portion. The mesa portion of the present example is provided to extend in the extension direction (the Y axis direction) along the trench, on the upper surface of the semiconductor substrate 10. In the present example, the transistor portion 70 is provided with a mesa portion 60, and the diode portion 80 is provided with a mesa portion 61. When the mesa portion is merely mentioned in the present specification, it refers to each of the mesa portion 60 and the mesa portion 61.

Each mesa portion is provided with the base region 14. In the mesa portion, a region arranged to be closest to the active side gate runner 131, in the base region 14 exposed on the upper surface of the semiconductor substrate 10, is set as a base region 14-e. While FIG. 13 illustrates the base region 14-e arranged at one end portion of each mesa portion in the extension direction, the base region 14-e is also arranged at the other end portion of each mesa portion. Each mesa portion may be provided with at least one of the emitter region 12 of a first conductivity type and the contact region 15 of the second conductivity type in a region interposed between the base regions 14-e in the top plan view. In the present example, the emitter region 12 is of the N+ type, and the contact region 15 is of the P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion up to the other trench portion in the X axis direction. As an example, the contact region 15 and the emitter region 12 in the mesa portion 60 are alternately arranged along the extension direction of the trench portion (the Y axis direction).

In another example, the contact region 15 and the emitter region 12 in the mesa portion 60 may be provided in a stripe shape along the extension direction of the trench portion (the Y axis direction). For example, the emitter region 12 is provided in a region in contact with the trench portion, and the contact region 15 is provided in a region interposed between the emitter regions 12.

The mesa portion 61 of the diode portion 80 is not provided with the emitter region 12. On an upper surface of the mesa portion 61, the base region 14 and the contact region 15 may be provided. In the region interposed between the base regions 14-e on the upper surface of the mesa portion 61, the contact region 15 may be provided in contact with each base region 14-e. On the upper surface of the mesa portion 61, the base region 14 may be provided in a region interposed between the contact regions 15. The base region 14 may be arranged in an entire region interposed between the contact regions 15.

Above each mesa portion, the contact hole 54 is provided. The contact hole 54 is arranged in the region interposed between the base regions 14-e. The contact hole 54 of the present example is provided above each region of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, the cathode region 82 of the N+ type is provided in a region in direct contact with the lower surface of the semiconductor substrate 10. On the lower surface of the semiconductor substrate 10, the collector region 22 of the P+ type may be provided in a region where the cathode region 82 is not provided. The cathode region 82 and the collector region 22 are provided between the lower surface 23 of the semiconductor substrate 10 and the buffer region 20. In FIG. 13, a boundary between the cathode region 82 and the collector region 22 is indicated by a dotted line.

The cathode region 82 is arranged to be away from the well region 11 in the Y axis direction. In this way, it is possible to improve a withstand voltage by securing a distance between the cathode region 82 and a region (the well region 11) of the P type that has a comparatively high doping concentration and that is formed up to a deep position. In the present example, an end portion of the cathode region 82 in the Y axis direction is arranged to be away from the well region 11 further than an end portion of the contact hole 54 in the Y axis direction. In another example, the end portion of the cathode region 82 in the Y axis direction may be arranged between the well region 11 and the contact hole 54.

Figure 14:
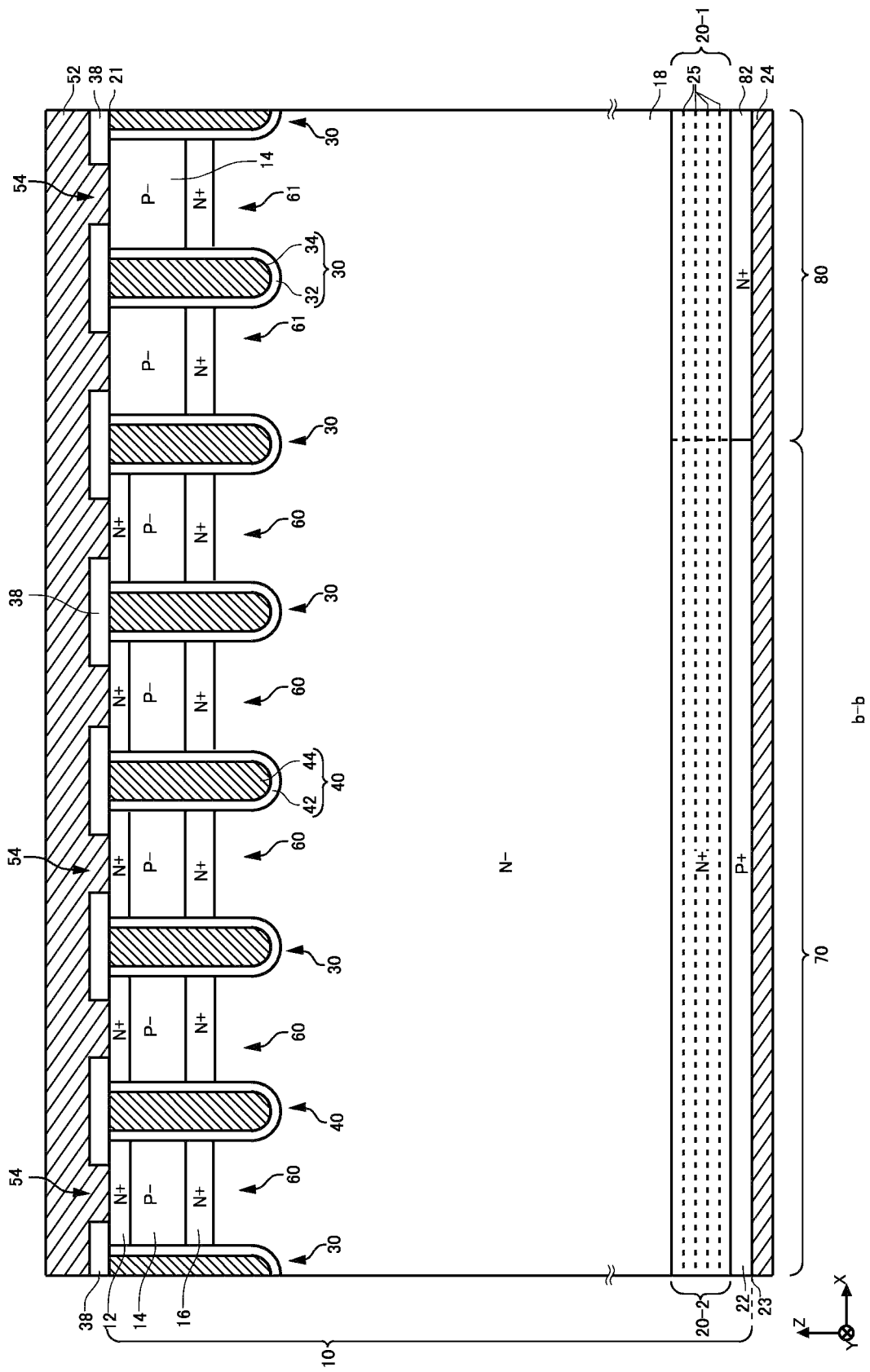
FIG. 14 is a view illustrating an example of a cross section b-b in FIG. 13.

FIG. 14 is a view illustrating an example of a cross section b-b in FIG. 13. The b-b cross section is an XZ plane passing through the emitter region 12 and the cathode region 82. The semiconductor device 100 of the present example has the semiconductor substrate 10, an interlayer dielectric film 38, the emitter electrode 52, and a collector electrode 24, in the cross section. The interlayer dielectric film 38 is provided on the upper surface of the semiconductor substrate 10. The interlayer dielectric film 38 is a film including at least one layer of a dielectric film such as silicate glass to which an impurity such as boron or phosphorus is added, a thermal oxide film, and other dielectric films. The interlayer dielectric film 38 is provided with the contact hole 54 described with reference to FIG. 13.

The emitter electrode 52 is provided above the interlayer dielectric film 38. The emitter electrode 52 is in contact with the upper surface 21 of the semiconductor substrate 10 through the contact hole 54 of the interlayer dielectric film 38. The collector electrode 24 is provided on the lower surface 23 of the semiconductor substrate 10. The emitter electrode 52 and the collector electrode 24 are formed of a metal material such as aluminum. In the present specification, the direction connecting the emitter electrode 52 and the collector electrode 24 (the Z axis direction) is referred to as the depth direction.

The semiconductor substrate 10 includes the drift region 18 of the N− type. The drift region 18 is provided in each of the transistor portion 70 and the diode portion 80.

The mesa portion 60 in the transistor portion 70 is provided with the emitter region 12 of the N+ type and the base region 14 of the P− type in order from the upper surface 21 side of the semiconductor substrate 10. Below the base region 14, the drift region 18 is provided. In the mesa portion 60, an N+ type accumulation region 16 may also be provided. The accumulation region 16 is arranged between the base region 14 and the drift region 18. The conductivity type of the dopant of the accumulation region 16 is the same as that of the drift region 18. The accumulation region 16 is a region having a doping concentration higher than that of the drift region 18. In the present example, the accumulation region 16 is a region having a donor concentration higher than that of the drift region 18.

The emitter region 12 is exposed on the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than that of the drift region 18.

The base region 14 is provided below the emitter region 12. The base region 14 of the present example is provided in contact with the emitter region 12. The base region 14 may be in contact with the trench portions on both sides of the mesa portion 60.

The accumulation region 16 is provided below the base region 14. The accumulation region 16 is an N+ type region having a doping concentration higher than that of the drift region 18. By providing the accumulation region 16 having the high concentration between the drift region 18 and the base region 14, it is possible to improve a carrier injection-enhancement effect (IE effect) and reduce an on-voltage. The accumulation region 16 may be provided to cover a whole lower surface of the base region 14 in each mesa portion 60.

The mesa portion 61 of the diode portion 80 is provided with the base region 14 of the P− type in contact with the upper surface 21 of the semiconductor substrate 10. Below the base region 14, the drift region 18 is provided. In the mesa portion 61, the accumulation region 16 may be provided below the base region 14.

Below the drift region 18 in each of the transistor portion 70 and the diode portion 80, the buffer region 20 of the N+ type may be provided. The buffer region 20 of the present example includes a first buffer region 20-1 provided to the diode portion 80 and a second buffer region 20-2 provided to the transistor portion 70. The first buffer region 20-1 is the same as the buffer region 20 described with reference to FIG. 1 to FIG. 11. The second buffer region 20-2 may be the same as the buffer region 20 described with reference to FIG. 1 to FIG. 11.

In the transistor portion 70, the collector region 22 of the P+ type is provided below the second buffer region 20-2. The collector region 22 is provided between the doping concentration peak 25-1, which is the shallowest concentration peak of the second buffer region 20-2, and the lower surface 23. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

In the diode portion 80, the cathode region 82 of the N+ type is provided below the first buffer region 20-1. The cathode region 82 is provided between the doping concentration peak 25-1, which is the shallowest concentration peak of the first buffer region 20-1, and the lower surface 23. A donor concentration of the cathode region 82 is higher than a donor concentration of the drift region 18. A donor of the cathode region 82 is, for example, hydrogen or phosphorus. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

On the upper surface 21 side of the semiconductor substrate 10, the one or more gate trench portions 40 and the one or more dummy trench portions 30 are provided. Each trench portion passes through the base region 14 to reach the drift region 18 from the upper surface 21 of the semiconductor substrate 10. In a region where at least any one of the emitter region 12, the contact region 15, and the accumulation region 16 is provided, each trench portion also penetrates the doping regions of these to reach the drift region 18. A structure in which the trench portion passes through the doping region is not limited to a structure in which the semiconductor substrate is manufactured in order of forming the doping region and then forming the trench portion. A structure in which the trench portions are formed and then the doping region is formed between the trench portions is also included in the structure in which the trench portion passes through the doping region.

As described above, the transistor portion 70 is provided with the gate trench portion 40 and the dummy trench portion 30. The diode portion 80 is provided with the dummy trench portion 30, and is not provided with the gate trench portion 40. In the present example, a boundary between the diode portion 80 and the transistor portion 70 in the X axis direction is the boundary between the cathode region 82 and the collector region 22. The semiconductor device 100 described with reference to FIG. 1 to FIG. 11 is provided with no trench portion, but the semiconductor device 100 described with reference to FIG. 1 to FIG. 11 may also be provided with the trench portion.

The gate trench portion 40 has a gate trench, a gate dielectric film 42, and a gate conductive portion 44 that are provided on the upper surface 21 of the semiconductor substrate 10. The gate dielectric film 42 is provided to cover an inner wall of the gate trench. The gate dielectric film 42 may be formed by oxidizing or nitriding a semiconductor on the inner wall of the gate trench. The gate conductive portion 44 is provided on an inner side further than the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided to be longer than the base region 14 in the depth direction. The gate trench portion 40 in the cross section is covered with the interlayer dielectric film 38 on the upper surface 21 of the semiconductor substrate 10. The gate conductive portion 44 is electrically connected to a gate runner. When a predetermined gate voltage is applied to the gate conductive portion 44, a channel is formed by an inversion layer with electrons on a surface layer in the base region 14 at an interface in contact with the gate trench portion 40.

The dummy trench portion 30 may have the same structure as the gate trench portion 40 in the cross section. The dummy trench portion 30 has a dummy trench, a dummy dielectric film 32, and a dummy conductive portion 34 that are provided on the upper surface 21 of the semiconductor substrate 10. The dummy conductive portion 34 is electrically connected to the emitter electrode 52. The dummy dielectric film 32 is provided to cover an inner wall of the dummy trench. The dummy conductive portion 34 is provided inside the dummy trench, and is provided on an inner side further than the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 of the present example are covered with the interlayer dielectric film 38 on the upper surface 21 of the semiconductor substrate 10. Note that bottom portions of the dummy trench portion 30 and the gate trench portion 40 may have curved surface shapes that are convex downward (curved line shapes in cross sections).

Figure 15:
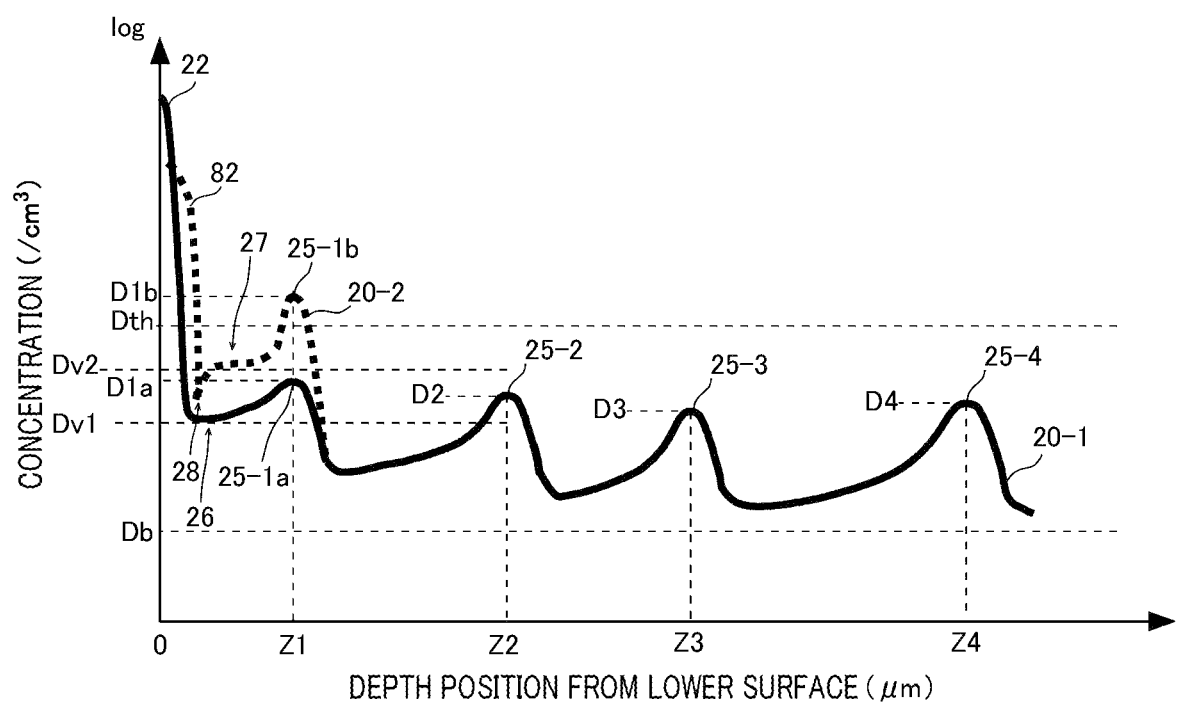
FIG. 15 is a diagram illustrating an example of the doping concentration distribution of a first buffer region 20-1 and of a second buffer region 20-2.

FIG. 15 is a diagram illustrating an example of the doping concentration distribution of the first buffer region 20-1 and the cathode region 82, and of the second buffer region 20-2 and the collector region 22. The doping concentration distribution in the first buffer region 20-1 is the same as the doping concentration distribution of any of the buffer regions 20 described with reference to FIG. 1 to FIG. 11. With this configuration, the oscillation during reverse recovery of the diode portion 80 can be suppressed.

The second buffer region 20-2 has one or more doping concentration peaks 25. The doping concentration peak 25 in the second buffer region 20-2 is provided at the same depth position as the doping concentration peak 25 in the first buffer region 20-1.

The doping concentrations at the doping concentration peaks 25 in the second buffer region 20-2 may be the same as the respective doping concentrations at the doping concentration peaks 25 provided at the same depth positions in the first buffer region 20-1. Thus, the second buffer region 20-2 may have the same doping concentration distribution as the first buffer region 20-1. In this case, the hydrogen chemical concentration distribution of the second buffer region 20-2 may be the same as the hydrogen chemical concentration distribution of the first buffer region 20-1. Alternatively, the depth position of a doping concentration peak 25-1$b$ of the second buffer region 20-2 may be closer to the lower surface 23 than the depth position of a doping concentration peak 25-1$a$ of the first buffer region 20-1 is. Thus, the depletion layer of the transistor portion 70 can stop at a position close to the collector region 22, whereby high injection of holes from the collector region 22 can be maintained.

As illustrated in FIG. 15, the doping concentration at the doping concentration peak 25-1$b$, which is the shallowest concentration peak of the second buffer region 20-2, may be higher than that at the doping concentration peak 25-1$a$, which is the shallowest concentration peak of the first buffer region 20-1. With this configuration, the depletion layer can be prevented from reaching the collector region 22 in the transistor portion 70, while the oscillation is suppressed in the diode portion 80. A doping concentration D1$b$ at the doping concentration peak 25-1$b$ may be 5 times, 10 times, or 20 times as high as a doping concentration D1$a$ at the doping concentration peak 25-1$a$ or higher.

The doping concentration D1$b$ at the doping concentration peak 25-1$b$ may be higher than the threshold concentration Dth. The doping concentration D1$b$ at the doping concentration peak 25-1$b$ may be 2 times, 5 times, or 10 times as high as the threshold concentration Dth or higher. With this configuration, in the transistor portion 70, the depletion layer can be more effectively prevented from reaching the collector region 22. The doping concentration between the doping concentration peak 25-1$b$ and the collector region 22 may include a second valley portion 27 defined by a valley shaped concentration distribution close to the doping concentration peak 25-1$b$ and a third valley portion 28 close to the collector region 22. The third valley portion 28 may be a boundary including a pn junction between the second buffer region 20-2 and the collector region 22. The doping concentration at the third valley portion 28 is a net concentration ($N_D$-$N_A$) of a donor concentration ($N_D$) and an acceptor concentration ($N_A$) at the third valley portion 28. The third valley portion 28 is a pn junction and thus the donor concentration and the acceptor concentration are the same. Thus, theoretically, the doping concentration of the third valley portion 28 is 0. The donor concentration in the third valley portion 28 may be a limited value other than 0. A donor concentration Dv2 in the second valley portion 27 is assumed to be the donor concentration at the boundary between the doping concentration peak 25-1$b$ and the collector region 22. The donor concentration Dv2 is the donor concentration Dv2 of the region in contact with the pn junction of the third valley portion 28 from the upper surface 21 of the semiconductor substrate 10. The donor concentration Dv2 of the second valley portion 27 may be a doping concentration at a portion where a derivative value obtained by differentiating the doping concentration with a depth position first becomes lower than 0.5, a doping concentration at a portion where the derivative value first becomes lower than 0.25, or a doping concentration at a portion where the derivative value first becomes 0, in the direction from the third valley portion 28 toward the second buffer region 20-2. The donor concentration Dv2 in the second valley portion 27 may be higher than the local minimum value Dv1 of the doping concentration in the first valley portion 26 of the first buffer region 20-1. With this configuration, the depletion layer can be more effectively prevented from reaching the collector region 22 in the transistor portion 70, and the reverse recovery oscillation of the diode portion 80 can be suppressed. The donor concentration Dv2 in the second valley portion 27 may be higher or lower than the predetermined threshold Dth. In the present example, the concentration is lower than the threshold. The donor concentration Dv2 in the second valley portion 27 may be higher or lower than the doping concentration peak 25-2. In the present example, the concentration is higher than the peak. With this configuration, the depletion layer can be more effectively prevented from reaching the collector region 22 in the transistor portion 70.

Figure 16:
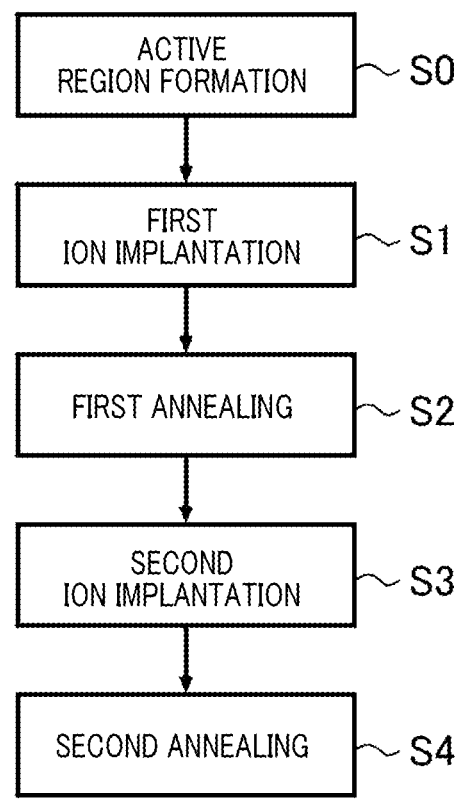
FIG. 16 is a flowchart illustrating some steps of a manufacturing method for the semiconductor device 100.

FIG. 16 is a flowchart illustrating some steps of a manufacturing method for the semiconductor device 100. FIG. 16 illustrates an example of a step where the first buffer region 20-1 and the second buffer region 20-2 are formed. The doping concentration peak 25-1b, which is the shallowest concentration peak of the second buffer region 20-2, may be formed as follows.

An upper surface 21 side structure of the semiconductor substrate 10, in the active portion 160 provided with the transistor portion 70 and the diode portion 80, is formed in the semiconductor substrate 10 (active region formation step S0). The upper surface 21 side structure refers to a structure provided more on the upper surface 21 side than the center of the semiconductor substrate 10 in the depth direction, in the configuration illustrated in FIG. 14, for example. For example, the upper surface 21 side structure includes the emitter region 12 of the transistor portion 70 and the base region 14 of the diode portion 80. The base region 14 of the diode portion 80 functions as the anode region of the diode. The upper surface 21 side of one or both of the transistor portion 70 and the diode portion 80 may include the trench portion.

Next, ion implantation of an N type dopant is performed for both the transistor portion 70 and the diode portion 80 from the lower surface 23 of the semiconductor substrate 10. Thus, the doping concentration peak 25-1a, which is the shallowest concentration peak of the first buffer region 20-1, is formed (first ion implantation step S1). Thus, in the first ion implantation step S1, the doping concentration peaks 25-1a with the same concentration are formed in both the transistor portion 70 and the diode portion 80. The dopant of the present example in the first ion implantation step S1 is hydrogen. After the first ion implantation step S1, thermal annealing may be performed on the semiconductor substrate 10 (first annealing step S2). The first annealing step S2 may be omitted. In the first ion implantation step S1, the concentration peaks other than the shallowest concentration peak may be formed in both the transistor portion 70 and the diode portion 80. Such concentration peaks can be formed by implanting the dopant for a plurality of times from the lower surface 23 of the semiconductor substrate 10, while changing the range of the dopant.

Next, ion implantation of an N type dopant is additionally performed for the transistor portion 70 only, from the lower surface 23 of the semiconductor substrate 10 (second ion implantation step S3). In the second ion implantation step S3, ions are additionally implanted to the depth position at which the doping concentration peak 25-1b is to be formed. In the present example, the depth position to which the dopant is implanted in the second ion implantation step S3 is the same as the depth position to which the dopant is implanted in the first ion implantation step S1. Thus, in the second ion implantation step S3, the dopant is implanted to overlap with the doping concentration peak 25-1a formed in the transistor portion 70. Thus, the doping concentration peak 25-1b, which is the shallowest concentration peak of the second buffer region 20-2, is formed. The doping concentration at the doping concentration peak 25-1b is higher than that at the doping concentration peak 25-1a, by the amount of the dopant additionally implanted in the second ion implantation step S3. After the second ion implantation step S3, thermal annealing may be performed on the semiconductor substrate 10 (second annealing step S4).

The dopant in the second ion implantation step S3 may be the same as or different from the dopant in the first ion implantation step S1. The dopant for the doping concentration peak 25-1b, which is the shallowest concentration peak of the second buffer region 20-2, may be hydrogen, and may further include phosphorus or arsenic. Alternatively, the dopant for the doping concentration peak 25-1b may be phosphorus or arsenic and not include hydrogen. The hydrogen donor concentration included in the doping concentration peak 25-1b may be higher or lower than the concentration of a donor other than the hydrogen included in the doping concentration peak 25-1b.

In the example illustrated in FIG. 16, the second ion implantation step S3 is implemented after the first ion implantation step S1, but the second ion implantation step S3 may be implemented before the first ion implantation step S1. Each time each of the first ion implantation step S1 and the second ion implantation step S3 is performed, thermal annealing is performed on the semiconductor substrate 10. Alternatively, a common thermal annealing step may be performed after the two ion implantation steps are performed.

The cathode region 82 and the collector region 22 may be formed before the buffer region 20 or may be formed after the buffer region 20. With such steps, the regions can be formed inside the semiconductor substrate 10.

Figure 17:
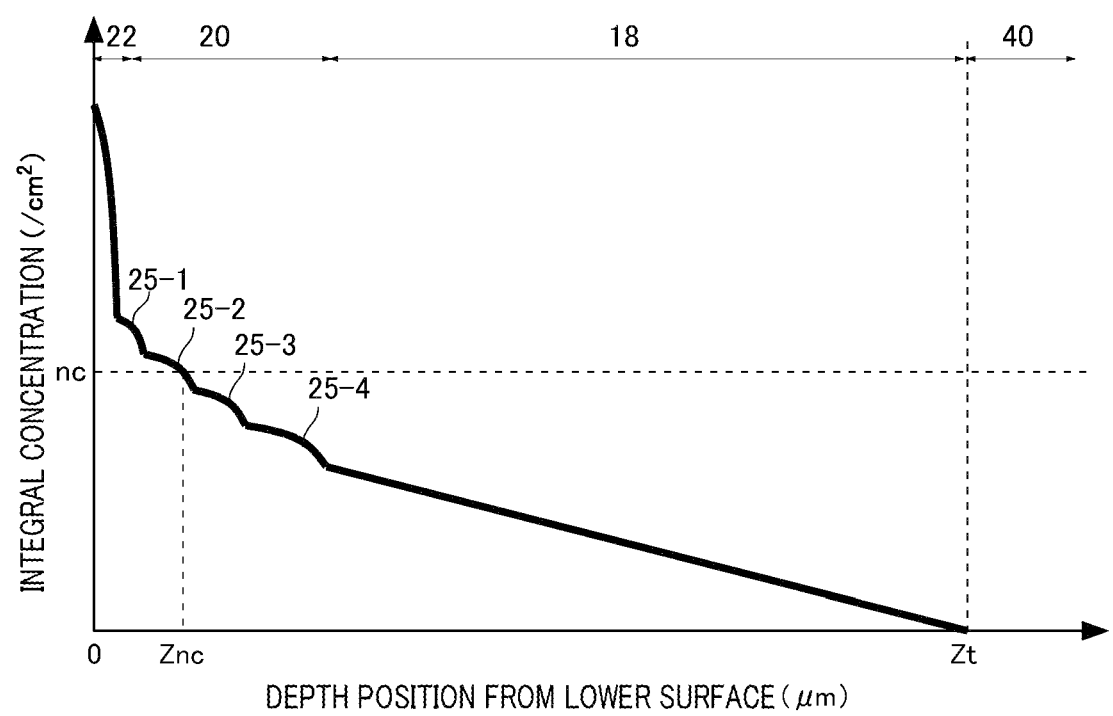
FIG. 17 is a diagram illustrating an example of integral concentration obtained by integrating the doping concentration in the semiconductor substrate 10 in a depth direction.

FIG. 17 is a diagram illustrating an example of integral concentration obtained by integrating the doping concentration in the semiconductor substrate 10 in the depth direction. The depth position of the lower end of the trench portion such as the gate trench portion 40 is denoted by Zt. In the present example, the concentration obtained by integrating the doping concentration of the semiconductor substrate 10 from the position Zt toward the lower surface 23 of the semiconductor substrate 10 is referred to as integral concentration. The starting point of the integration of the doping concentration in the depth direction may be the depth position of the drift region 18 closest to the lower end of the base region 14, instead of the position Zt.

The doping concentration of the drift region 18 is substantially uniform. Thus, the integral concentration linearly increases toward the lower surface 23. In the buffer region 20 and the collector region 22 (or the cathode region 82), the integral concentration increases toward the lower surface 23, in accordance with the doping concentration in each of these regions.

The depth position at which the integral concentration exceeds a critical integral concentration nc of the semiconductor substrate 10 is defined as a critical position Znc. The critical integral concentration $n_c$ is an integral concentration at the depth position that the depletion layer spreading toward the lower surface 23 side from the depth position of the drift region 18 closest to the lower end of the base region 14 reaches, in a state where avalanche breakdown has occurred due to the maximum value of the field intensity reaching a critical field intensity $E_c$ as a result of increasing the forward bias applied between the upper surface 21 and the lower surface 23 of the semiconductor substrate 10. The value of the critical field intensity $E_c$ may be $1 \times 10^5$ (V/cm) or more, and may be $3 \times 10^5$ (V/cm) or less. For example, the value of the critical field intensity $E_c$ is $2 \times 10^5$ (V/cm). Assuming that $E_c$ represents critical field intensity, q represents elementary charge ($1.602 \times 10^{-19}$ [C]), $\varepsilon_0$ represents permittivity of vacuum ($8.854 \times 10^{-14}$ [F/cm]), and $\epsilon_r$ represents relative permittivity of a matter, the critical integral concentration $n_c$ is $E_c(\varepsilon_r \varepsilon_0 / q) = n_c$. The relative permittivity of silicon is 11.9. The critical integral concentration $n_c$ may be $8.0 \times 10^{11}$ (/cm$^2$) or more. The critical integral concentration $n_c$ may be $2.0 \times 10^{12}$ (/cm$^2$) or less. In the present example, critical integral concentration $n_c$ is $1.2 \times 10^{12}$ (/cm$^2$).

Preferably, the critical position Znc overlaps the doping concentration peak 25-1, which is the shallowest concentration peak, or is arranged closer to the trench portion than the doping concentration peak 25-1 is. The critical position Znc overlapping the doping concentration peak 25-1 may refer to a state where the critical position Znc is arranged within the full width at half maximum of the doping concentration peak 25-1. With this configuration, the depletion layer spreading from the lower end of the base region 14 toward the lower surface 23 side can be prevented from reaching the collector region 22 or the cathode region 82. The critical position Znc may be arranged within the buffer region 20.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: Semiconductor Substrate, 11: Well Region, 12: Emitter Region, 14: Base Region, 15: Contact Region, 16: Accumulation Region, 18: Drift Region, 20: Buffer Region, 21: Upper Surface, 22: Collector Region, 23: Lower Surface, 24: Collector Electrode, 25: Doping Concentration Peak, 26: First Valley Portion, 27: Second Valley Portion, 28: Third Valley Portion, 29: Linear Portion, 30: Dummy Trench Portion, 31: Edge Portion, 32: Dummy Dielectric Film, 34: Dummy Conductive Portion, 38: Interlayer Dielectric Film, 39: Linear Portion, 40: Gate Trench Portion, 41: Edge Portion, 42: Gate Dielectric Film, 44: Gate Conductive Portion, 52: Emitter Electrode, 54: Contact Hole, 60, 61: Mesa Portion, 70: Transistor Portion, 80: Diode Portion, 81: Extension Region, 82: Cathode Region, 83: Lower Surface Side Region, 90: Edge Termination Structure Portion, 100: Semiconductor Device, 102: End Side, 112: Gate Pad, 125: Hydrogen Concentration Peak, 130: Outer Peripheral Gate Runner, 131: Active Side Gate Runner, 160: Active Portion

What is claimed is:

1. A semiconductor device comprising:
   a semiconductor substrate including a bulk donor; and
   a first buffer region of a first conductivity type, the first buffer region being provided on a lower surface side of the semiconductor substrate and having one or more doping concentration peaks and one or more hydrogen concentration peaks in a depth direction of the semiconductor substrate, wherein
   a doping concentration at a shallowest concentration peak, out of the doping concentration peaks of the first buffer region, closest to the lower surface of the semiconductor substrate is 50 times as high as a bulk donor concentration of the semiconductor substrate or lower, and
   the doping concentration at the shallowest concentration peak is lower than a reference carrier concentration obtained when current that is 1/10 of rated current flows between an upper surface and the lower surface of the semiconductor substrate.

2. The semiconductor device according to claim 1, wherein doping concentrations at all of the doping concentration peaks of the first buffer region are 50 times as high as the bulk donor concentration or lower.

3. The semiconductor device according to claim 1, wherein the first buffer region has two or more of the doping concentration peaks, and a doping concentration at at least one of the doping concentration peaks is higher than 50 times as high as the bulk donor concentration.

4. The semiconductor device according to claim 2, wherein the first buffer region has two or more of the doping concentration peaks, and a doping concentration at at least one of the doping concentration peaks is higher than the doping concentration at the shallowest concentration peak.

5. The semiconductor device according to claim 4, wherein the doping concentration at the shallowest concentration peak is lower than a doping concentration of the doping concentration peak that is closest to the shallowest concentration peak.

6. The semiconductor device according to claim 1 further comprising a trench portion arranged on an upper surface of the semiconductor substrate, wherein
   when a concentration obtained by integrating a doping concentration of the semiconductor substrate from a lower end of the trench portion toward the lower surface of the semiconductor substrate is defined as an integral concentration, and a position at which the integral concentration reaches a critical integral concentration of the semiconductor substrate is defined as a critical position,
   the critical position overlaps the shallowest concentration peak or is arranged closer to the trench portion than the shallowest concentration peak is.

7. The semiconductor device according to claim 1 further comprising a cathode region of the first conductivity type, having a peak value of a doping concentration that is higher than the shallowest concentration peak, the cathode region being provided between the shallowest concentration peak and the lower surface of the semiconductor substrate.

8. The semiconductor device according to claim 7 further comprising a lower surface side region of a second conductivity type provided between the shallowest concentration peak and the lower surface of the semiconductor substrate.

9. The semiconductor device according to claim 7, wherein a local minimum value of a valley portion of a donor concentration between the shallowest concentration peak and the cathode region is smaller than a second concentration peak adjacent to the shallowest concentration peak on a side that is closer to an upper surface of the semiconductor substrate than the shallowest concentration peak is.

10. The semiconductor device according to claim 1 further comprising a collector region of a second conductivity type provided between the shallowest concentration peak and the lower surface of the semiconductor substrate.

11. The semiconductor device according to claim 1 comprising: a transistor portion; and a diode portion, wherein
    the diode portion includes:
    the first buffer region; and
    a cathode region of the first conductivity type provided between the first buffer region and the lower surface of the semiconductor substrate, and
    the transistor portion includes:
    a second buffer region of the first conductivity type, the second buffer region being provided on the lower surface side of the semiconductor substrate and having one or more doping concentration peaks and one or more hydrogen concentration peaks in the depth direction of the semiconductor substrate; and
    a collector region of a second conductivity type provided between the second buffer region and the lower surface of the semiconductor substrate.

12. A semiconductor device comprising:
    a semiconductor substrate including a bulk donor;

a first buffer region of a first conductivity type, the first buffer region being provided on a lower surface side of the semiconductor substrate and having one or more doping concentration peaks and one or more hydrogen concentration peaks in a depth direction of the semiconductor substrate;

a transistor portion; and a diode portion, wherein a doping concentration at a shallowest concentration peak, out of the doping concentration peaks of the first buffer region, closest to the lower surface of the semiconductor substrate is 50 times as high as a bulk donor concentration of the semiconductor substrate or lower, the diode portion includes:
  the first buffer region; and
  a cathode region of the first conductivity type provided between the first buffer region and the lower surface of the semiconductor substrate, the transistor portion includes:
  a second buffer region of the first conductivity type, the second buffer region being provided on the lower surface side of the semiconductor substrate and having one or more doping concentration peaks and one or more hydrogen concentration peaks in the depth direction of the semiconductor substrate; and
  a collector region of a second conductivity type provided between the second buffer region and the lower surface of the semiconductor substrate, and doping concentrations at each of the doping concentration peaks in the second buffer region are the same as doping concentrations at the doping concentration peaks provided at the same depth positions in the first buffer region.

13. A semiconductor device comprising:
a semiconductor substrate including a bulk donor;
a first buffer region of a first conductivity type, the first buffer region being provided on a lower surface side of the semiconductor substrate and having one or more doping concentration peaks and one or more hydrogen concentration peaks in a depth direction of the semiconductor substrate;
a transistor portion; and
a diode portion, wherein
a doping concentration at a shallowest concentration peak, out of the doping concentration peaks of the first buffer region, closest to the lower surface of the semiconductor substrate is 50 times as high as a bulk donor concentration of the semiconductor substrate or lower,
the diode portion includes:
  the first buffer region; and
  a cathode region of the first conductivity type provided between the first buffer region and the lower surface of the semiconductor substrate,
the transistor portion includes:
  a second buffer region of the first conductivity type, the second buffer region being provided on the lower surface side of the semiconductor substrate and having one or more doping concentration peaks and one or more hydrogen concentration peaks in the depth direction of the semiconductor substrate; and
  a collector region of a second conductivity type provided between the second buffer region and the lower surface of the semiconductor substrate, and
a doping concentration at a doping concentration peak, out of the doping concentration peaks of the second buffer region, closest to the lower surface of the semiconductor substrate is higher than the doping concentration at the shallowest concentration peak of the first buffer region.

14. A semiconductor device comprising:
a semiconductor substrate including a bulk donor;
a first buffer region of a first conductivity type, the first buffer region being provided on a lower surface side of the semiconductor substrate and having one or more doping concentration peaks and one or more hydrogen concentration peaks in a depth direction of the semiconductor substrate;
a transistor portion; and
a diode portion, wherein
a doping concentration at a shallowest concentration peak, out of the doping concentration peaks of the first buffer region, closest to the lower surface of the semiconductor substrate is 50 times as high as a bulk donor concentration of the semiconductor substrate or lower,
the diode portion includes:
  the first buffer region; and
  a cathode region of the first conductivity type provided between the first buffer region and the lower surface of the semiconductor substrate,
the transistor portion includes:
  a second buffer region of the first conductivity type, the second buffer region being provided on the lower surface side of the semiconductor substrate and having one or more doping concentration peaks and one or more hydrogen concentration peaks in the depth direction of the semiconductor substrate; and
  a collector region of a second conductivity type provided between the second buffer region and the lower surface of the semiconductor substrate, and
a local minimum value of a valley portion of a donor concentration between the shallowest concentration peak and the cathode region is smaller than a donor concentration at a boundary between a shallowest concentration peak of the second buffer region and the collector region.

15. A semiconductor device comprising:
a semiconductor substrate including a bulk donor; and
a first buffer region of a first conductivity type, the first buffer region being provided on a lower surface side of the semiconductor substrate and having one or more doping concentration peaks and one or more hydrogen concentration peaks in a depth direction of the semiconductor substrate, wherein
a doping concentration at a shallowest concentration peak, out of the doping concentration peaks of the first buffer region, closest to the lower surface of the semiconductor substrate is 50 times as high as a bulk donor concentration of the semiconductor substrate or lower, and
the doping concentration at the shallowest concentration peak, out of the doping concentration peaks of the first buffer region, is lower than the doping concentration peak farthest from the lower surface of the semiconductor substrate.

16. The semiconductor device according to claim 15, wherein the doping concentration at the shallowest concentration peak, out of the doping concentration peaks of the first buffer region, is lower than any of the other doping concentration peaks.

17. A semiconductor device comprising:
a semiconductor substrate including a bulk donor; and
a first buffer region of a first conductivity type, the first buffer region being provided on a lower surface side of the semiconductor substrate and having one or more doping concentration peaks and one or more hydrogen concentration peaks in a depth direction of the semiconductor substrate, wherein a doping concentration at a shallowest concentration peak, out of the doping concentration peaks of the first buffer region, closest to the lower surface of the semiconductor substrate is 50 times as high as a bulk donor concentration of the semiconductor substrate or lower, and the doping concentration at the shallowest concentration peak, out of the doping concentration peaks of the first buffer region, closest to the lower surface of the semiconductor substrate is 10 times as high as the bulk donor concentration or lower.

* * * * *